United States Patent
Moona et al.

(10) Patent No.: US 7,203,912 B2
(45) Date of Patent: Apr. 10, 2007

(54) COMPILING MEMORY DEREFERENCING INSTRUCTIONS FROM SOFTWARE TO HARDWARE IN AN ELECTRONIC DESIGN

(76) Inventors: Rajat Moona, 475, Indian Institute of Technology, Kanpur 208016 (IN); Russell Alan Klein, 2075 Alpine Dr., West Linn, OR (US) 97068

(*) Notice: Subject to any disclaimer, the term of this patent is extended or adjusted under 35 U.S.C. 154(b) by 257 days.

(21) Appl. No.: 10/896,431

(22) Filed: Jul. 21, 2004

(65) Prior Publication Data

US 2006/0031791 A1    Feb. 9, 2006

(51) Int. Cl.
*G06F 17/50* (2006.01)

(52) U.S. Cl. .............................. 716/3; 716/2

(58) Field of Classification Search .............. 716/1, 716/3, 2, 4, 18
See application file for complete search history.

(56) References Cited

U.S. PATENT DOCUMENTS

| | | | |
|---|---|---|---|
| 6,053,947 A | 4/2000 | Parson | |
| 6,226,776 B1 | 5/2001 | Panchul et al. | |
| 6,457,164 B1 | 9/2002 | Hwang et al. | |
| 6,484,177 B1 | 11/2002 | Van Huben et al. | |
| 6,487,698 B1* | 11/2002 | Andreev et al. | 716/3 |
| 6,584,601 B1 | 6/2003 | Kodosky et al. | |
| 2002/0133788 A1* | 9/2002 | Waters et al. | 716/3 |
| 2003/0074640 A1* | 4/2003 | Mandell et al. | 716/3 |
| 2003/0121010 A1* | 6/2003 | Aubury | 716/4 |

OTHER PUBLICATIONS

Ade et al., "Hardware-Software Codesign with GRAPE," *Proceedings of the Sixth IEEE International Workshop on Rapid System Prototyping*, pp. 40-47 (Jun. 1995).

(Continued)

*Primary Examiner*—Jack Chiang
*Assistant Examiner*—Binh Tat
(74) *Attorney, Agent, or Firm*—Klarquist Sparkman, LLP

(57) ABSTRACT

Electronic system functionality can be initially implemented as software code (e.g., in programming languages such as C, C++ or Pascal) and selectively converted to a hardware representation such as in hardware description language (e.g., VHDL, Verilog, HandelC, BachC, SpecC and System Verilog). In one aspect, software code representations comprising memory dereferencing operations (e.g., related to pointers, arrays and structs) may also be converted to a hardware representation. The newly converted hardware representation may be given control of a main communications network (e.g., system bus) of the electronic system to control the execution of the memory dereferencing operations (e.g., related to pointers, arrays and structs). In one embodiment, bus control may be via a bus control interface adapted for a particular kind of communications network (e.g., a processor bus, a system bus, a hierarchical bus, a cross bar, a multiplexer bus, a switch network and a point to point network). In another embodiment, a software memory dereferencer for executing memory dereferencing operations may be provided.

32 Claims, 17 Drawing Sheets

OTHER PUBLICATIONS

Elliott, J.P., *Understanding Behavioral Synthesis*, "Table of Contents," "Chapter 2: An Introduction to Behavioral Synthesis" "Chapter 3: The Behavioral Synthesis Process," "Chapter 4: Data Types," "Chapter 5: Entities, Architectures, and Processes," "Chapter 10: Functions, Procedures, and Packages," "Chapter 12: Reusable Test Benches," "Chapter 13: Coding for Behavioral Synthesis," "Index, " Kluwer Academic Publishers Group, pp. v-xiv, 5-23, 25-40, 41-55, 57-76, 173-180, 197-211, 213-243, 313-319 (1999).
"Monet Interactive Architectural Exploration Through Behavioral Design," 3pp. [Downloaded from the World Wide Web on Feb. 6, 2002.].
"Monet Technical Papers," 1p. [Downloaded from the World Wide Web on Feb. 6, 2002.].
Elliott, J., *An Introduction to Architectural Exploration*, "Part I: Introduction & Terminology," 8pp. (Mar. 1998).
Elliott, J., *An Introduction to Architectural Exploration*, "Part II: I/O Modes," 12pp. (Apr. 1998).
Elliott, J., *An Introduction to Architectural Exploration*, "Part III: Loops," 8pp. (Apr. 1998).
Elliott, J., *An Introduction to Architectural Exploration*, "Part IV: Handshaking," 4pp. (Apr. 1998).
Elliott, J., *An Introduction to Architectural Exploration*, "Part V: Reusable Test Benches," 8pp. (Apr. 1998).
Wayne Wolf, "Object-Oriented Co-Synthesis of Distributed Embedded Systems," Proc. ASP-DAC '95, pp. 553-558 (1995).
Lipton et al., "PDL++: An Optimizing Generator Language for Register Transfer Design," IEEE International Symposium on Circuits and Systems, pp. 1135-1138 (1990).
Liao et al., "An Efficient Implementation of Reactivity for Modeling Hardware in the Scenic Design Environment," Proc. DAC '97, 6pp. (1997).
De Micheli et al., "The Olympus Synthesis System," IEEE Design & Test of Computers, vol. 7, Issue 5, pp. 37-53 (Oct. 1990).
Zhu et al., "Syntax and Semantics of the SpecC Language," Proc. Workshop on Synthesis and System Integration of Mixed Technologies, 8 pp. (Dec. 1997).
Guido Arnout, "SystemC Standard," Proc. DAC '00, pp. 573-577 (2000).
Semeria et al., "Methodology for Hardware/Software Co-verification in C/C++," Proc. DAC '00, pp. 405-408 (2000).
Miscellaneous Web pages printed from CynApps World Wide Web site, 28 pp. [Downloaded from the World Wide Web on Sep. 14, 2001.].
CynApps, "CynLib™ Language Reference Manual," Cynlib Release 1.4.0, 90 pp. [Downloaded from the World Wide Web on Sep. 14, 2001.].
CynApps, "CynLib Users Manual," Cynlib Release Version 1.4.0, 120 pp. [Downloaded from the World Wide Web on Sep. 14, 2001.].
John Sanguinetti, "Bridging the Gap with Cynthesis," 6 pp. [Downloaded from the World Wide Web on Sep. 14, 2001.].
Andy Goodrich, "Design by Successive Elaboration," 12 pp. [Downloaded from the World Wide Web on Sep. 14, 2001.].
Svarstad et al., "A Model for Describing Communication between Aggregate Objects in the Specification and Design of Embedded Systems," 9pp. [Downloaded from the World Wide Web on Nov. 4, 2001.].
Mueller et al., "The Simulation Semantics of SystemC," 7 pp. [Downloaded from the World Wide Web on Nov. 4, 2001.].
Siegmund et al., "SystemC*SV*: An Extension of SystemC for mixed Multi-Level Communication Modeling and Interface-Based System Design," 7 pp. [Downloaded from the World Wide Web on Nov. 4, 2001.].
Economakos et al., "Behavioral Synthesis with SystemC," 5 pp. [Downloaded from the World Wide Web on Nov. 4, 2001.].
Charest et al., "A Methodology for Interfacing Open Source SystemC with a Third Party Software," 5 pp. [Downloaded from the World Wide Web on Nov. 4, 2001.].
Fin et al., "SystemC: A Homogenous Environment to Test Embedded Systems," 6 pp. [Downloaded from the World Wide Web on Nov. 4, 2001.].
Fin et al., "The Use of SystemC for Design Verification and Integration Test of IP-Cores," 5 pp. [Downloaded from the World Wide Web on Nov. 4, 2001.].
Agliada et al., "On the Reuse of VHDL Modules into SystemC Designs," 5 pp. [Downloaded from the World Wide Web n Nov. 4, 2001.].
Fin et al., "Amleto: A Multi-language Environment for Functional Test Generation," 8 pp. [Downloaded from the World Wide Web on Nov. 4, 2001.].
Heinz-Josef Schlebusch, "Converging SystemC with VSIA System-Level Data Types," VSIA Member Meeting, VSIA Alliance, 16 pp. (Mar. 13, 2001). [Downloaded from the World Wide Web on Nov. 4, 2001.].
Stuart Swan, "An Introduction to System Level Modeling in SystemC 2.0," Open SystemC Initiative, 13 pp. (May 2001). [Downloaded from the World Wide Web on Nov. 4, 2001.].
Thomas Komarek, "C Based System Level Design," 60 pp. [Downloaded from the World Wide Web on Nov. 4, 2001.].
Bollano et al., "SystemC's Impact on the Development of IP Libraries," IP2000 Europe Conference, 9 pp. (Oct. 2000). [Downloaded from the World Wide Web on Nov. 4, 2001.].
Heinz-Josef Schlebusch, "C-based Design of Systems-on-Chip: An EDA Perspective," 45 pp. [Downloaded from the World Wide Web on Nov. 4, 2001.].
Gerlach et al., "System Level Design Using the SystemC Modeling Platform," 5 pp. [Downloaded from the World Wide Web on Nov. 4, 2001.].
Kranen et al., "Open SystemC Initiative," SystemC Users Forum, DAC—Jun. 2000, 74 pp. [Downloaded from the World Wide Web on Nov. 4, 2001.].
Transmodeling, Inc., "Systems to HDL Incrementally, SystemC" 7 pp. (Apr. 2000). [Downloaded from the World Wide Web on Nov. 4, 2001.].
"Modeling A 3D Graphics Pipeline with SystemC," ST Microelectronics, Advanced System Technology, SNUG, 7 pp. (Mar. 15, 2000). [Downloaded from the World Wide Web on Nov. 4, 2001.].
"Overview of the Open SystemC Initiative," 2 pp. [Downloaded from the World Wide Web on Nov. 4, 2001.].
Karen Bartleson, "A New Standard for System-Level Design," Synopsys, 6 pp. (Sep. 1999). [Downloaded from the World Wide Web on Nov. 4, 2001.].
Jamison et al., "Connecting the Value Chain with SystemC," 4 pp. (Sep. 1999). [Downloaded from the World Wide Web on Nov. 4, 2001.].
Guido Arnout, "C for System Level Design," 4 pp. [Downloaded from the World Wide Web on Nov. 4, 2001.].
Gerstlauer et al., "SpecC System-Level Design Methodology Applied to the Design of a GSM Vocoder," Proc. Ninth Workshop on Synthesis and System Integration of Mixed Technologies, Kyoto, Japan, 8 pp. ( Apr. 2000).
Andreas Gerstlauer, "SpecC, Center for Embedded Computer Systems," 3 pp. [Downloaded on Nov. 4, 2001].
Dömer et al., "The SpecC Language Reference Manual," Technical Report ICS-98-13, Dept. Information and Computer Science, University of California, Irvine, 65 pp. (1998).
Gerstlauer et al., "VHDL+/SpecC Comparisons—A Case Study," Technical Report ICS- 98-23, Dept Information and Computer Science, University of California, Irvine, 40 pp. (1998).
Dömer et al., "SpecC Language Reference Manual," Version 1.0, 88 pp. (Mar. 6, 2001).
Doemer, "SpecC Language Reference Manual, V1.0," Release Notes, 3 pp. (Mar. 2001).
Rumbaugh, James et al., *Object-Oriented Modeling and Design*, "Copyright Page," "Table of Contents," "Chapter 1: Introduction," and "Index," Prentice-Hall, Inc., pp. ii, iii-viii, 1-14, and 291-500 (1991).
Shlaer, Sally et al., *Object Lifecycles: Modeling the World in States*, "Copyright Page," "Table of Contents," "Chapter 1: Overview of Object-Oriented Analysis," and "Index," Prentice-Hall, Inc., pp. iv, v-viii, 1-9, and 245-251 (1992).

\* cited by examiner

COMPILING MEMORY DEREFERENCING INSTRUCTIONS FROM SOFTWARE TO HARDWARE IN AN ELECTRONIC DESIGN

TECHNICAL FIELD

The technical field relates to electronic design. More particularly, the field relates to methods and apparatus for designing an electronic system optimally partitioned between software and hardware components.

BACKGROUND

An electronic system may comprise software components (e.g., to be executed on a general purpose processor), a general purpose processor (e.g., an Intel® x86 architecture processor), memory (e.g., random access, hard disk or read only) and other hardware components (e.g., field programmable gate arrays (FPGA) or other programmable logic, application specific integrated circuits (ASIC) or a System on Chip (SOC) including software and hardware such as FPGA's or ASIC). The design of such an electronic system may begin with an implementation of selected system functionality in a high-level software programming language (e.g., C, C++, or Pascal). However, depending on design objectives, it may be beneficial to implement selected functions of the system in hardware (e.g., as FPGAs or other programmable logic, ASIC or SOC). However, before incurring the costs associated with physically migrating selected system components to a hardware implementation, designers may choose to model the new hardware implementation (e.g., via emulation or simulation) along with the rest of the system components to ensure that the new system design will function properly once implemented. Furthermore, the new system design, including its hardware and software components, may be modeled together to verify whether system performance may be improved by repartitioning the system between its hardware and software components.

One way to model hardware is to describe system functions to be implemented as hardware in a hardware description language (HDL) (e.g., Verilog, VHDL, SystemC, SpecC, HandelC, BachC or other suitable hardware description languages) and to use such HDL descriptions in conjunction with electronic design automation (EDA) tools, such as logic simulators (e.g., ModelSim by Mentor Graphics®) and hardware emulators (e.g., an IKOS machine such as VStation by Mentor Graphics®). Once a description of the hardware function is rendered in HDL, the HDL design may be processed to render a gate level design of the hardware using synthesis programs, for instance. Then conventional physical design tools may be used to reduce the gate level design to an actual hardware implementation (e.g., within an FPGA or other programmable logic, ASIC or SOC). Thus, a designer can progress towards an optimized physical implementation of the system design while verifying and evaluating various design options without having to physically implement the various options in actual hardware.

The HDLs however are difficult to learn and require special knowledge. Most ordinary computer programmers are not familiar with such languages. There have been efforts to develop HDLs that are similar in some aspects to conventional software programming languages (e.g., C, C++ or Pascal). For instance, development of System C was one such effort. Even with such improvements, these languages (e.g., SystemC, HandelC, BachC or SpecC) are still HDLs and very different from ordinary high-level software programming languages (e.g., C, C++ or Pascal).

Thus, it may be beneficial to first implement an electronic system design in software using conventional software programming languages (e.g., C, Pascal, or C++) and convert selected system functionality to an HDL description to be modeled as hardware. To this end, EDA tools have been proposed that can take an unmodified high-level programming language description (e.g., C, C++ or Pascal) of an electronic system and convert such a description to an HDL description. For instance, U.S. Pat. No. 6,226,776 to Panchul describes one such system for converting C-type software programs into register transfer level (RTL) HDL descriptions. However, this and other EDA tools and methods for converting system functions described in a conventional software programming language (e.g., C, C++, or Pascal) to an HDL description suffer from many shortcomings that avoid or make difficult the task of converting certain types of software instructions into HDL.

For instance, many of the conventional software programming languages (e.g., C, C++, or Pascal) provide for various instructions to implement memory address dereferencing schemes, such as pointers, arrays and structs. In conventional EDA tools, such memory dereferencing is either not at all converted to HDL or they are done so in an inefficient manner. Thus, there is a need for improved methods and systems for migrating electronic system functions implemented originally using conventional software programming languages (e.g., C, C++, or Pascal) into a hardware representation (e.g., in an HDL such as Verilog, VHDL or System C).

SUMMARY

Described herein are methods and apparatus for optimizing electronic system design by selecting software components of an electronic system components to be converted into a hardware representation (e.g., in an HDL such as Verilog or VHDL or System C). In one aspect, memory dereferencing operations related to pointers, arrays, structs and the like are also converted from a software implementation to a hardware implementation such that the execution of at least one such memory dereferencing operation is desirably partially or more desirably, entirely controlled by the hardware implementation. In one further aspect, such memory dereferencing operations may relate to memory elements not local to the hardware implementation.

In one aspect, a hardware compiler can parse the software code representations of selected system functions implemented as software code in programming languages such as C, C++, or Pascal and compile such software code including any memory dereferencing operations into a hardware representation (e.g., an HDL such as VHDL, Verilog or System C). Such a hardware representation may later be converted to an actual hardware implementation (e.g., as FPGAs or other programmable logic, ASIC or SOC). In another aspect, at least one interface may be generated to allow newly generated hardware components to control the execution of memory dereferencing operations by obtaining control of a main communications network of the system.

In a further aspect, via such an interface to the main communications network of the system the newly generated hardware components may dereference any memory address related any memory elements associated with the system (e.g., main memory or memory local to the newly generated hardware components).

In one aspect, control of the communications network may be via a generated bus control interface. The bus control interface may be a hardware implementation (e.g., an HDL such as VHDL, Verilog or System C) adapted to arbitrate for control of at least one kind communications network such as an core connect bus, an AMBA bus, a processor bus (e.g., ARM bus), a system bus, a hierarchical bus, a cross bar, a multiplexer bus, a Point to Point interconnection or a switch network. In another aspect, the bus control interface may be generated as a hardware representation of state machines in an HDL which can later be synthesized to actual hardware such as one or more FPGAs or other programmable logic, ASIC or SOC.

In yet another aspect, control of the communications network may be obtained via a generated software memory dereferencer capable of assisting, allowing or otherwise enabling the newly generated hardware components in exercising control over the system's main communications network. In one aspect, the memory dereferencer may be implemented whenever the newly generated hardware components are not directly communicative with the main communications network of the system.

In one additional aspect, a memory map may be generated for the newly generated hardware components and ranges of memory addresses in such a map allocated in such a manner, so as to avoid conflict between or otherwise interfere with memory dereferencing operations initiated and controlled by the newly generated hardware components and those other operations addressed to a hardware interface controlled by a main processor of the system. These are just some of the features. Additional features and advantages will be made apparent from the following detailed description of illustrated embodiments, which proceeds with reference to accompanying drawings.

DETAILED DESCRIPTION

The disclosed invention includes all novel and unobvious features and aspects of the embodiments of the system and methods described herein both alone in various combinations and sub-combinations thereof. The disclosed features and aspects of the embodiments can be used alone or in various novel and unobvious combinations and sub-combinations with one another.

Although the operations of the disclosed methods are described in a particular, sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "determine" to describe the disclosed methods. Such terms are high-level abstractions of the actual operations that are performed. The actual operations that correspond to these terms will vary depending on the particular implementation and are readily discernible by one of ordinary skill in the art.

Some of the methods described herein can be implemented in software stored on a computer-readable medium and executed on a computer. Some of the disclosed methods, for example, can be implemented as part of an electronic design automation (EDA) tool. Also, for instance, such methods can be executed on a single computer or a networked computer or a collection of networked computer. For clarity, only those aspects of the software germane to these disclosed methods are described; product details well known in the art are omitted. For the same reason, the computer hardware is not described in detail.

Exemplary Electronic Systems With Hardware and Software Components

Figure 1:
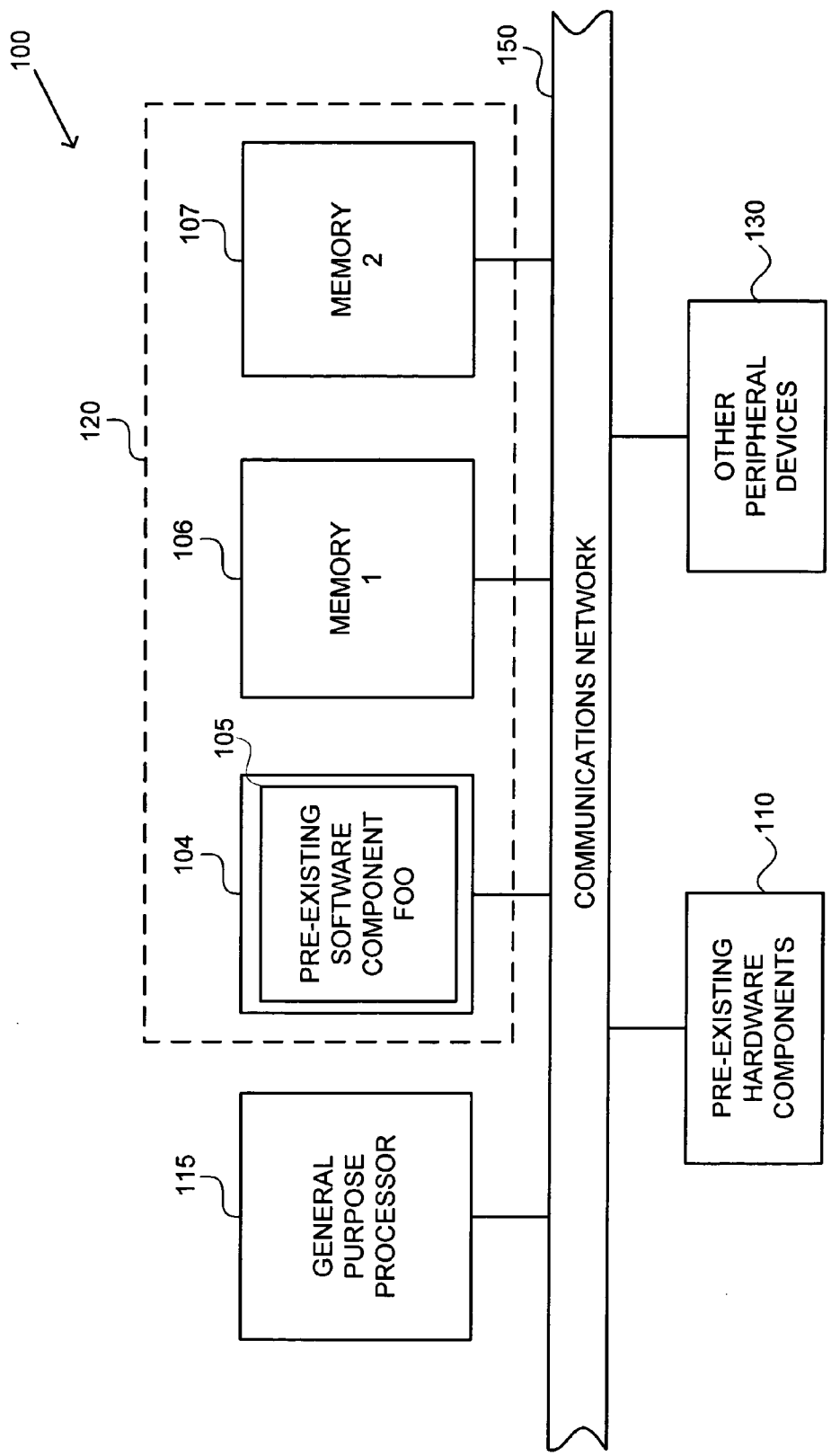
FIG. 1 is a block diagram illustrating an exemplary electronic system comprising hardware and software components.

FIG. 1 illustrates an exemplary electronic system 100 with hardware and software components. For instance, as shown in FIG. 1, selected functions (e.g., function Foo at 105) may be implemented as software code, whereas certain other system functionality may be implemented as hardware (e.g., 110). The software components (e.g., 105) may be stored in memory 104. The software components (e.g., 105) may be modules of software code written in a software programming language (e.g., C, C++ or Pascal). The hardware components (e.g., 110) may include one or more FPGAs or other programmable logic, ASIC, SOC or HDL.

Thus, a system 100, its functionality and implementation thereof, may be apportioned between hardware components (e.g., 110) and software components (e.g., 105). One factor that may influence performance of the system 100 is the selection of which of the system's functions are implemented in hardware (e.g., 110) versus software (e.g., 105). Even so, selection of whether to implement certain system functionality as software (e.g., 105) or as hardware (e.g., 110) may not be the only factor that affects the eventual performance of the system. Nevertheless, in general, implementing a selected system function as hardware improves the speed of execution of such functions. Additionally, it may also improve the execution speed of the system 100 as a whole, because implementing at least one of the system functionality in hardware may reduce the demands on the processor 115 executing the software functions (e.g., 105). However, before committing to a physical implementation of the hardware portion of the system design, a designer may model the hardware design using an EDA modeling tool (e.g., a simulator or an emulator) to execute an HDL representation of the hardware design, for instance, in VHDL, Verilog or System C. EDA tools may be used to model HDL representations of the hardware components (e.g., 110) along with software components (e.g., 105) to verify system performance.

Besides memory devices (e.g., 104) for storing the software components (e.g., 105), the system may comprise other memory devices such as memory 1 at 106 and memory 2 at 107 may be used to store other data used for executing system functionality. Other peripheral devices 130 (e.g., video monitor, printer, and other input/output devices) also may be included in the system 100. Furthermore, system components may communicate with each other via a communications network 150. For example, the network 150 may include an AMBA bus, a processor bus (e.g., ARM bus), a system bus, a hierarchical bus, a cross bar, a multiplexer bus, a Point to Point interconnection, a switch network or other means of exchanging data between the various components of the system 100.

Also, the system 100 may comprise more than a single general purpose processor (e.g., 115). Multiple different general purpose processors may execute various different software components (e.g. 105) of the system 100.

Exemplary Repartitioning of an Electronic System

Figure 2:
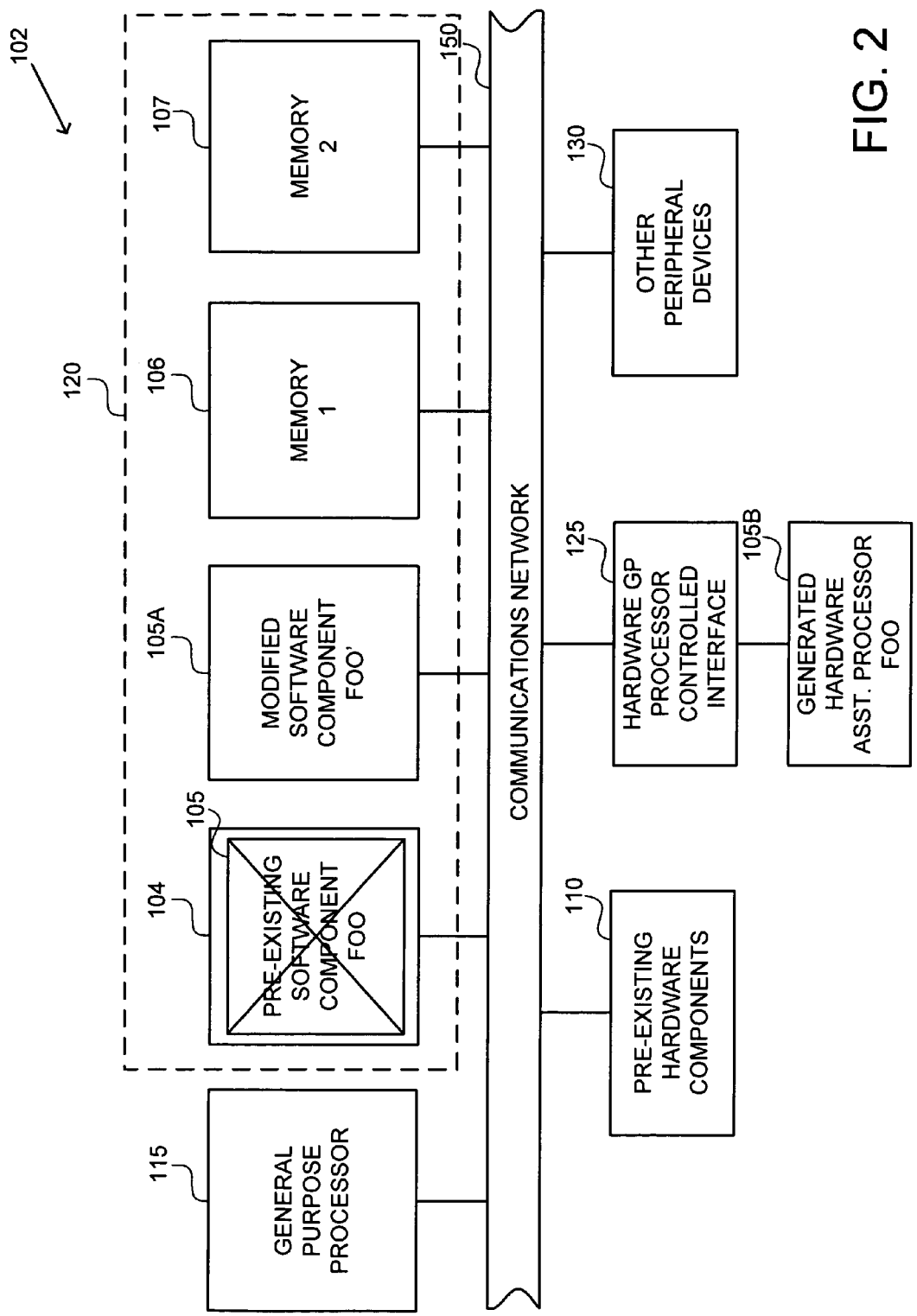
FIG. 2 is a block diagram illustrating the system of FIG. 1 reapportioned between its hardware and software components by converting selected software components (e.g., those implementing at least a portion of selected functions of the system) to a hardware implementation.

Whereas components of an electronic system may be first designed and implemented entirely as software code written in a software programming language (e.g., C, C++, or Pascal), due to various design objectives, it may be desirable to repartition the system 100 between hardware and software components by moving selected system functionality initially implemented as software into hardware implementations. Thus, as shown in FIG. 2, selected software components (e.g., 105) from the original system 100 may be removed (or otherwise caused to be severed from the rest of the system or otherwise rendered innocuous) and instead, a hardware implementation (e.g., the assistant processor 105B) of the system functionality originally implemented as software (e.g., 105) may be added along with a modified software component (e.g., 105A) to create a repartitioned system 102 of FIG. 2. The newly added hardware components (e.g., the hardware assistant processor 105B) may implement those functions originally implemented as software (e.g., 105) whereas the modified software components (e.g., 105A) may function as an interface for the newly added hardware components (e.g., the hardware assistant processor 105B) to communicate with the rest of the system 102. The newly added hardware components (e.g. the hardware assistant processor 105B) may implement other functionality besides system functionality originally implemented as software.

For instance, the newly added hardware components (e.g., the hardware assistant processor 105B) may be implemented in hardware such as an FPGA or other programmable logic or as an ASIC. As such, in one embodiment, the modified software component may comprise software code in a programming language (e.g., C, C++ or Pascal) for passing parameters and other data related to system functions newly implemented within the hardware components (e.g., the hardware assistant processor 105B), waiting for it to execute the function and returning the results of any such execution to the rest of the system 102. In addition to the modified software components (e.g., 105A) a hardware interface (e.g., 125) controlled by a general purpose processor (e.g., 115) may be generated to further enable communication between the newly generated hardware components (e.g., the hardware assistant processor 105B) and the rest of the system 102. In particular, such a hardware interface 125 controlled by a general purpose processor 115 may, among other things, comprise address decode logic needed for the communications network 150 to drive the communications from the rest of the system 102 into appropriate registers of the newly generated hardware components (e.g. the hardware assistant processor 105B).

Further information regarding methods and systems for repartitioning an electronic system 100 may be found in the published U.S. application Ser. No. 10/295,538 filed Nov. 15, 2002 (U.S. Pub. No. US-2004-0098701-A1, published May 20, 2004) which is incorporated herein by reference. In particular, FIGS. 1–7 and 13–15 and their corresponding detailed description, provide information on methods and systems for repartitioning an electronic system between its hardware and software components by selectively moving system components from software to hardware. Additional detail may be found throughout the rest of the published application U.S. Pub. No. US-2004-0098701-A1.

An Exemplary Method for Converting Selected Software Components to Hardware

Figure 3:
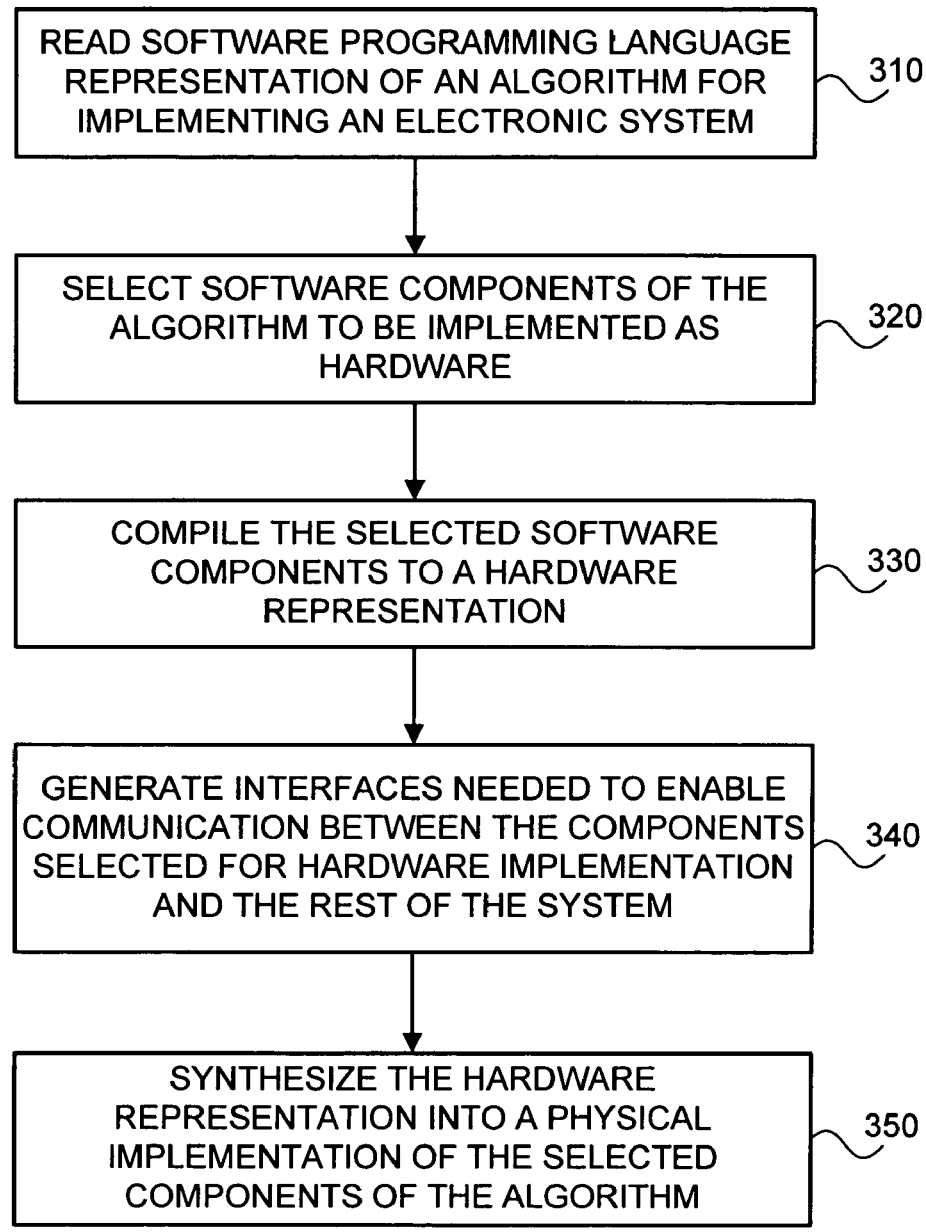
FIG. 3 is a flow diagram describing an exemplary method for converting selected components of a system algorithm initially implemented as software code using a conventional software programming language (e.g., C, C++, or Pascal) into an actual hardware implementation (e.g., as an FPGA or other programmable logic, as an ASIC or as an SOC).

FIG. 3 illustrates an exemplary method for converting selected components of a system algorithm initially implemented as software code written in conventional software programming language (e.g., C, C++ or Pascal) into an actual hardware implementation (e.g., as an FPGA or other programmable logic, as an ASIC or SOC). As such, an algorithm representative of the entire system functionality may be initially implemented as software code (e.g., C, C++ or Pascal), because such programming languages are widely understood, easier to implement, and more flexible than implementing these functions initially in actual hardware (e.g., programmable hardware such as FPGAs, as ASIC or SOC) or as a representation of the hardware in HDL (e.g., Verilog, VHDL or SystemC). Thus, system functions may be converted from software code implementation (e.g., in C, C++ or Pascal) into an HDL representation (e.g., in VHDL, Verilog or SystemC) and the new design may be modeled to verify its performance. Various combinations of software and hardware implementations can be modeled. As such, a designer may experiment with multiple different system models while honing and optimizing the system design.

FIG. 3 illustrates one method of converting software components implemented in a software programming language (e.g., C, C++ or Pascal) to an actual hardware implementation. At 310, a software programming language representation of an electronic system algorithm is read. Then at 320, software components of the system algorithm initially implemented in software programming code (e.g., in C, C++ or Pascal) are selected to be implemented as hardware instead. One or more such software components may be selected for conversion into hardware. One criteria for selecting software components for a hardware implementation may be the demands placed on a general purpose processor (e.g., 115) by the selected software components. Once selected, at 330, the selected software components are compiled into a hardware representation such as VHDL, Verilog or SystemC. Additionally, at 340 interfaces (e.g., modified software components at 105A and the hardware interface 125 controlled by the general purpose processor 115) may be added to the system to enable the newly generated hardware assistant processor (e.g., 105B) to communicate with the rest of the system 102. Then at 350, the hardware representation (e.g., in VHDL, Verilog or SystemC) may be synthesized into a physical implementation in actual hardware such as FPGAs, other programmable logic or ASIC.

Exemplary Methods for Optimally Selecting Software Components to be Implemented as Hardware Prior to synthesizing HDL representations of hardware components of a system (e.g., 105B of FIG. 2) into actual hardware implementations it may be desirable to decide whether the design as apportioned between its hardware and software components is satisfactory. Thus, as shown FIG. 4 at 410, the performance profile of an electronic system may be generated and the profile data may be used at 420 to decide if the system should be repartitioned by reapportioning between its software and hardware components. In such repartitioning, some of the components currently implemented as software may be modeled as hardware and the converse may be true as well wherein some of the components currently modeled as hardware may be moved to a software implementation. Nevertheless, the functionality of the repartitioned system may be verified at 430 to ensure that it executes the desired functionality of the system and later at 440, the repartitioned system's performance may be measured to generate a performance profile of the repartitioned system. This performance profile may be used further to select other apportionments between hardware and software components until an acceptable apportionment between the software and hardware components of the system function is reached.

One criteria for selecting components for apportionment may the data related to time needed for executing the components. This may be available in the performance profile for both software and hardware components. Other criteria include, bus transactions and memory transactions related each of the components. For instance, converting a selected software component to hardware may improve its execution time but it may result in a greater number of bus transactions, which may be undesirable.

The hardware components may be modeled using a hardware execution vehicle. Hardware execution vehicles include but are not limited to logic simulators (e.g., ModelSim™ from Mentor Graphics®), FPGAs, accelerators (e.g. an IKOS machine from Mentor Graphics) or In Circuit Emulators (ICE). Software components may be modeled using a software execution vehicle. Software execution vehicles include but are not limited to Instruction Set Simulators (ISS) that are adapted to emulate the behavior of a particular processor or In Circuit Emulators (ICE) adapted to emulate the behavior of a particular processor. Together the software execution vehicle and the hardware execution vehicle can provide the data needed to assemble the performance profile of an entire electronic system comprising both hardware and software components.

Additional details related to repartitioning a system by generating its performance profile may be found in the published U.S. application Ser. No. 10/295,538 filed Nov. 15, 2002 (U.S. Pub. No. US-2004-0098701-A1, published May 20, 2004), mentioned above. Additionally, it may be not necessary to co-simulate the repartitioned system to generate its performance profile (e.g., 420). Instead, performance measurements of selected software components collected from a previous execution of the system may be reused to generate the performance profile of the combined repartitioned system. Methods and systems for generating such patched performance profiles may be found in published U.S. patent application Ser. No. 10/295,193 filed Nov. 15, 2002 (U.S. Pub. No. US-2004-0098242-A1, published on May 20, 2004), which is incorporated herein by reference. In particular, FIG. 4 of the published U.S. patent application Ser. No. 10/295,193 (U.S. Pub. No. US-2004-0098242-A1) and its accompanying detailed description provide exemplary methods for generating patched performance profiles of a repartitioned system. The rest of the publication provides additional details regarding the same.

Figure 5:
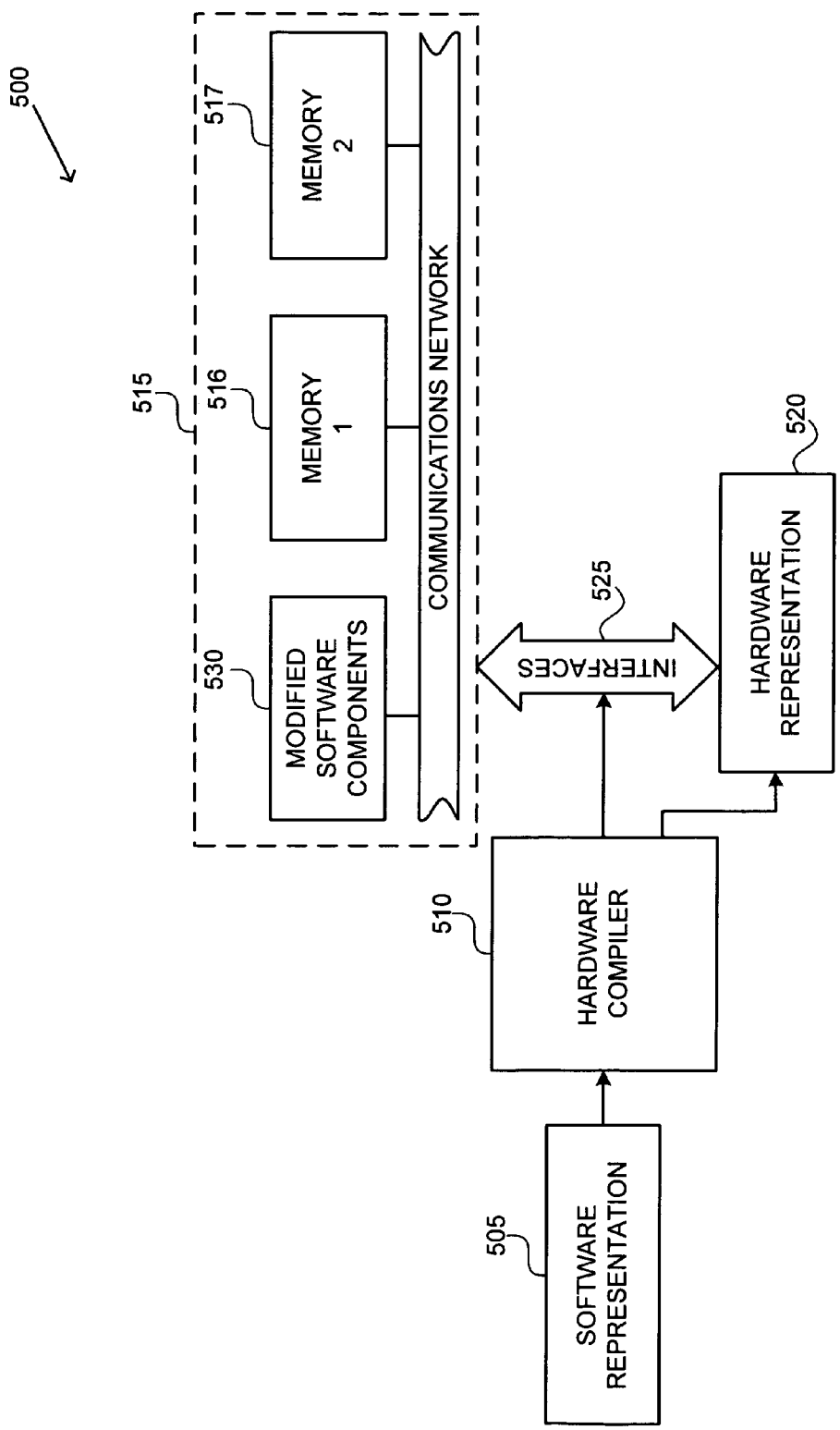
FIG. 5 is a block diagram illustrating an exemplary hardware compiler tool for compiling software code representations (e.g., in C, C++, or Pascal) of selected software components of an electronic system into a hardware representation (e.g., in VHDL, Verilog, or SystemC).

An Exemplary System for Compiling Selected Software Components to a Hardware Representation As noted above, system functions initially implemented in software code (e.g., in C, C++ or Pascal) may be converted to an HDL representation (e.g., for modeling a new system design) to verify improvement in overall system performance. FIG. 5 illustrates an exemplary hardware compiler tool 510 for compiling a software representation 505 (e.g., in C, C++ or Pascal) of selected functions of an electronic system (e.g., 100) into a hardware representation 520. The hardware representation may be in an HDL such as, Verilog, VHDL, or SystemC which can be further synthesized to an actual hardware implementation such as an FPGA or other programmable logic or ASIC. Additionally, the hardware compiler tool 510 may generate interfaces 525 (e.g., hardware interface 125 of FIG. 2 controlled by a general purpose processor 115) that enable communication between the newly generated hardware components 520 and the rest of the system 515 (e.g., the modified software components 530 and memory 516 and 517). For instance, the modified software components 530 (105A in FIG. 2) may provide an interface for the rest of the system 515 to send and receive data to the newly generated hardware component 520. The modified software components 530 may be generated by the hardware compiler tool 510 itself or other EDA tools capable of implementing such modified software components.

Exemplary Memory Dereferencing Operations in a Software Code Representation

Most programming languages including C provide for syntax for describing references to addresses in memory. Such references themselves may be addresses and thus, refer to other memory locations where some other values of interest may be stored. For instance, the following syntax in C creates a reference to an address in memory where a value related to a particular variable may be stored:

```
int i;
int *p = &i;
```

The above syntax will create an integer variable "i" and a pointer variable p that points to an address in memory "&i" where a value corresponding to the variable "i" will be stored. For instance, the operation *p=17 would set the value of "i" to the number 17.

Thus, reading a value stored in a location referred to by a memory reference or writing into a memory location may be referred to as dereferencing. Such memory dereferencing syntax may be used on either side of an operator. In this manner, operations related to reading from memory or writing to memory may be performed by the using memory addresses and dereferencing such addresses. Most software programmers rely on such memory dereferencing operations. In addition to variable pointers (e.g., "p" in C), other memory dereferencing operations may include references to a memory address that is a constant or a struct (e.g., "->" in C) or beginning of an array, or other approaches of referring to memory locations where data may be stored.

Exemplary System Functions Using Memory Dereferencing

Figure 6A:
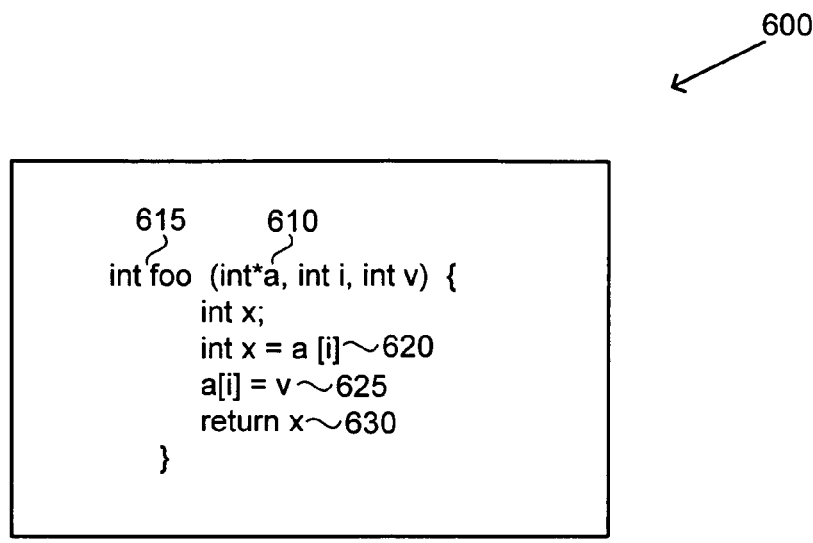
FIG. 6A is a listing of software code representations of exemplary memory dereferencing operations.
Figure 6B:
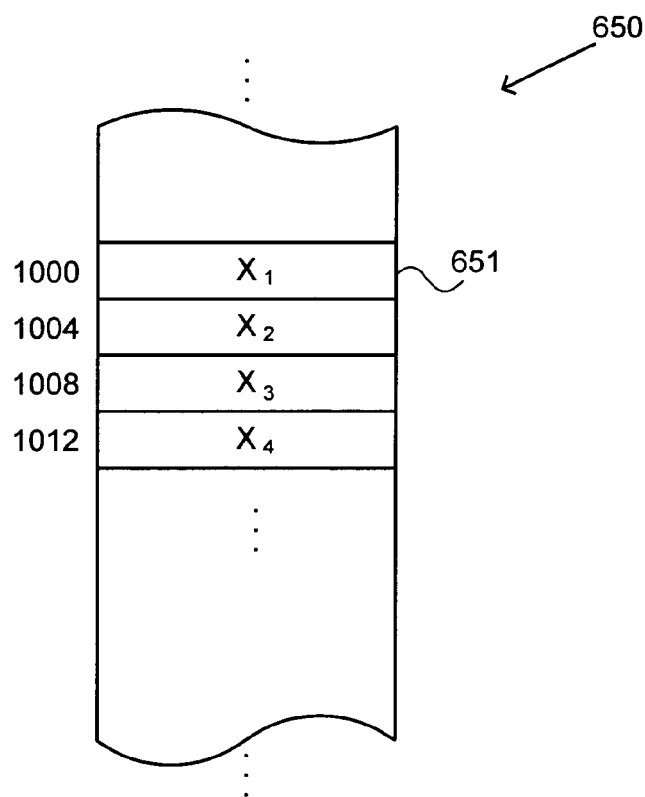
FIG. 6B is a block diagram illustrating an exemplary array data type that may be used in the code representation of FIG. 6A

As shown in FIG. 6A, a function Foo 600 related to an electronic system may use memory dereferencing operations such as pointers (e.g, "a" at 610). In this instance, the expression "*a" dereferences the pointer "a" and at 610 it is passed from outside the function "Foo" as a parameter. The exemplary function "Foo" has memory read and write operations that call for dereferencing memory addresses related to the variable pointer "a." In this particular example, the expression "*a" dereferences the pointer "a" that points to an array a[ . . . ] as shown at 650 in FIG. 6B. Initially, at 620 in FIG. 6A, a variable "x" is assigned a value read from the $i^{th}$ location of the array where "i" is also a variable. This would represent a read operation with memory dereferencing based on the variable pointer "a" and the values stored at a[i] being assigned to that variable "x". Then at 625, a value associated with the variable "v" is written into the ith location a[i] of the array 650. This would represent an exemplary write operation involving memory dereferencing based on the variable pointer "a." Then at 630, the old value that was stored at a[i] and assigned to "x" is returned to the original caller of the exemplary function Foo.

For instance, if a value of 1000 is passed initially as variable pointer "a" and value 3 is initially passed as value for variable "i" then an array 650 beginning at the address 1000 is accessed. The original value "$X_3$" stored at address 1012 (assuming a word size of 4, 3×4=12 and 12+1000=1012) corresponding to the array position a[3] is read and assigned to variable "x." Then a new value "v" is written into the same array location a[3] or address 1012.

These are just exemplary operations involving memory dereferencing. Other memory dereferencing operations are possible. For instance, memory dereferencing may not involve an array. In addition, a memory dereferencing variable may involve multiple dereferencing. For instance, a double variable pointer "**p" calls for the address "p" to be first dereferenced and then dereference the address value found at address pointed to by "p" to find another value. Such multiple dereferencing cannot be done at compile time since the address value found after the first dereferencing operation may change during execution.

Exemplary Methods for Compiling Software Code to Hardware Representation Including Memory Dereferencing Operations Whereas software programmers rely significantly on memory dereferencing operations when implementing selected system functionality as software code (e.g., in C, C++, or Pascal), these operations are difficult to migrate to a hardware implementation. In particular, when system functions including memory dereferencing operations are implemented as software code (e.g., in C, C++ or Pascal) to be executed by a general purpose processor, execution of the memory dereferencing operations is controlled by the processor executing such software code. However, if such software code (e.g., 105 of FIG. 2) is to be implemented faithfully in hardware (e.g., as an FPGA or other programmable logic or an ASIC) such newly generated hardware components (e.g., 105B of FIG. 2) should control the execution of the memory dereferencing operations now implemented in hardware and not the general purpose processor (e.g., 115).

Figure 7:
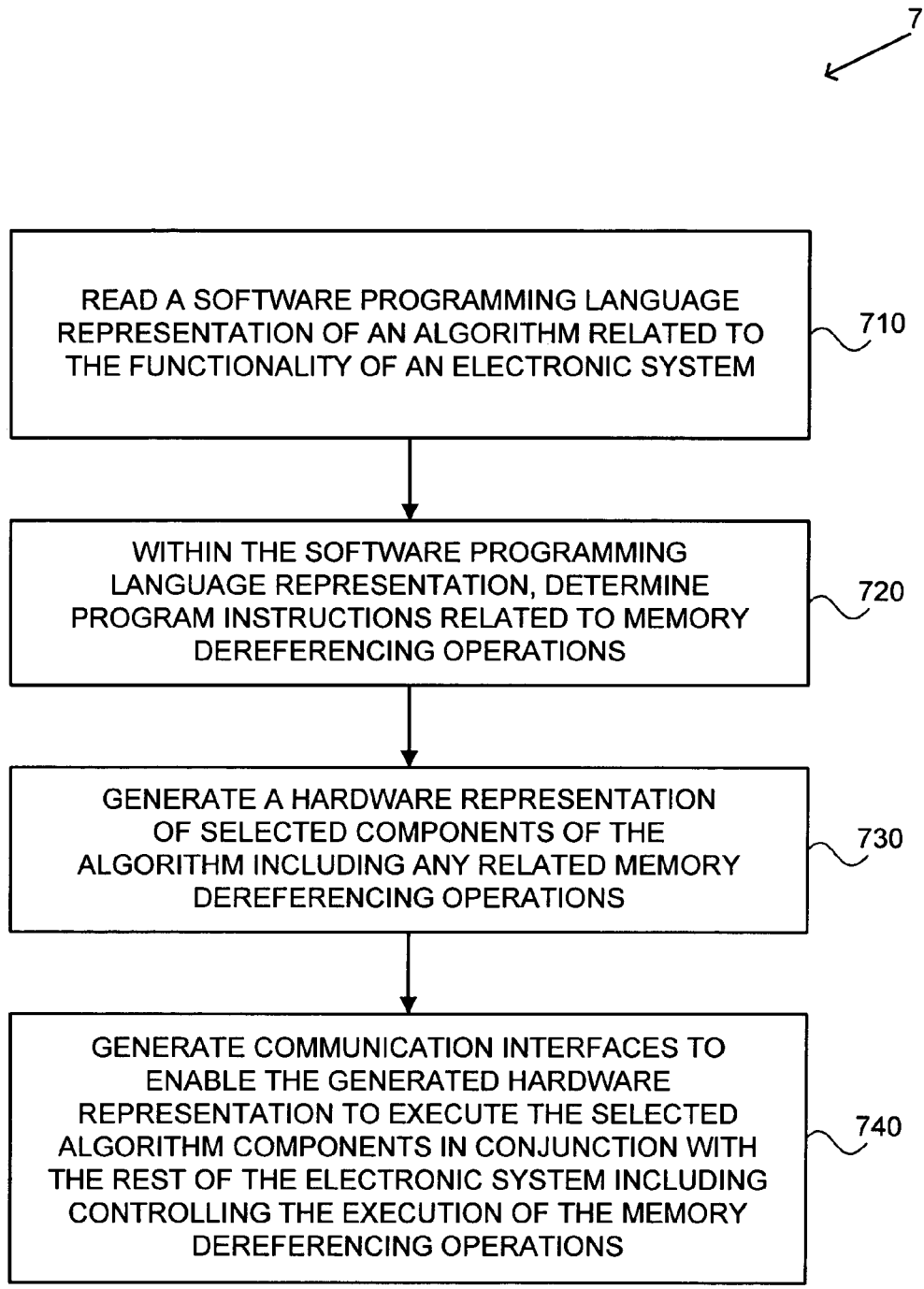
FIG. 7 is a flow diagram illustrating one overall method for converting software code representations comprising instructions related to memory dereferencing operations into hardware representations.

The method of FIG. 7 provides one such method 700 wherein software code comprising memory dereferencing operations (e.g., in C, C++, or Pascal) are compiled into a hardware representation (e.g., in VHDL or Verilog). At 710, software code representations (e.g., in C, C++ or Pascal) of electronic system components are read into a hardware compiler tool (e.g., 510 of FIG. 5). Then at 720, within the software code representation (e.g., in C, C++ or Pascal) of the algorithm or selected components thereof, software program constructs (e.g., instructions in C, C++ or Pascal) that relate to memory dereferencing operations are determined. In one example, this may be done by parsing for particular syntax (depending on the programming language) indicative of memory dereferencing operations. For instance, in the C programming language an asterisk (*) is indicative of a pointer based memory dereferencing operation.

In one example, the entire system algorithm for implementing a desired functionality may be read in and processed for determining which of its constructs involve memory dereferencing such as pointer based operations. Alternatively, only selected components or portions of the algorithm originally implemented in software (e.g., in C, C++, or Pascal) are read in for compilation to a hardware representation (e.g., in an HDL such as VHDL or Verilog). Nevertheless, software code components (e.g., in C, C++ or Pascal) of the system algorithm selected to be compiled into a hardware representation are desirably compiled to generate a hardware representation (e.g., in an HDL such as VHDL or Verilog) of the system functionality including functionality related to memory dereferencing. Such hardware representations may then be synthesized to implement the selected system functionality in actual hardware (e.g., in an FPGA or other programmable logic or an ASIC).

Then at 740, communication interfaces are also generated to enable the newly generated hardware components to execute their corresponding system functions in conjunction with the rest of the electronic system including system memory elements (106 and 107 in FIG. 2). In particular, the generated interfaces may include those that allow for newly generated hardware components to control the execution of memory dereferencing operations related to system functions they are implementing. For instance, the newly generated hardware components (e.g., 105B of FIG. 2) may gain control of the communications network 150 and access system memory elements 106 and 107 for executing read and write operations thereon by driving memory address information onto the communications network 150.

By such an exemplary approach, the hardware implementation of system functionality that was initially implemented in software code (e.g., in C, C++, or Pascal) to be executed by a general purpose processor (e.g., 115) can be faithfully represented in a hardware implementation (e.g., in an HDL such as VHDL or Verilog). For instance, a system function implemented as software to be executed by the general purpose processor can pass an address value related to a system memory element (e.g., 106 or 107 in FIG. 2) not local to the newly generated hardware components. However, by using an interface to gain control of the main communications network 150 connected to these system memory elements (e.g., 106 and 107), the newly generated hardware components 105B can control the execution of memory dereferencing operations related to addresses within such system memory elements (e.g., 106 and 107).

Figure 8:
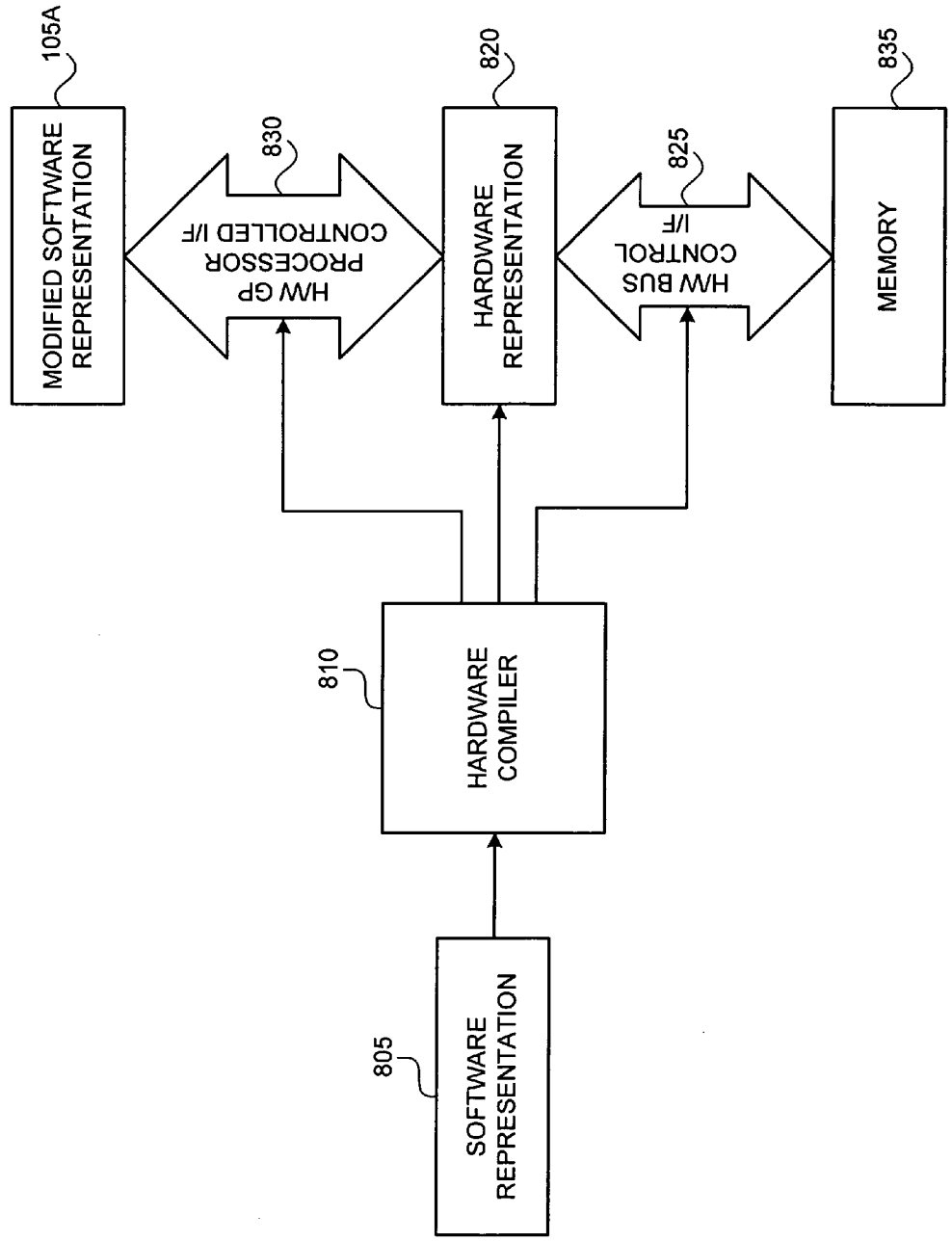
FIG. 8 is a block diagram illustrating an exemplary system and method for compiling software code representations comprising memory dereferencing operations into a hardware representation and generating a bus control interface to enable the newly generated hardware components to control the execution of at least one of the memory dereferencing operations.

An Exemplary System for Compiling Software Code to a Hardware Representation Including Implementing Memory Dereferencing Operations Using a Bus Control Interface FIG. 8 illustrates an exemplary system for compiling software code (e.g., in C, C++ or Pascal) related to a software implementation of an electronic system function into a hardware representation (e.g., in an HDL such as VHDL or Verilog) that can be eventually synthesized to an actual hardware implementation. Some of these system functions may call for memory dereferencing operations. These memory dereferencing operations may also be implemented as hardware.

As shown in FIG. 8, the system comprises a hardware compiler tool 810 that can parse a software code representation 805 (e.g., in C, C++ or Pascal) of selected software components of a system and generate a hardware representation 820 (e.g., in an HDL such as VHDL, Verilog or System C). Some of these software components may call for memory dereferencing. An exemplary approach to converting such software components in a programming language representation (e.g., in C, C++ or Pascal) to a hardware representation (e.g., in an HDL such as VHDL, Verilog or System C) is to translate it first to high-level flow charts that correspond to the functionality of the software components. Such high-level flow charts may then be used to generate synthesizable HDL. Several tools are currently available to convert software components in a programming language to a HDL representation. Behavioral Compiler™ by Synopsys® of San Jose, Calif. and DK1 by Celoxica® of Abingdon, UK are only a few of the examples. An emulator or a simulator can use the synthesizable HDL for modeling the system now reapportioned between its software and hardware parts.

In addition to representing the computational aspects of selected system functions in a hardware representation 820, the hardware compiler tool 810 may also generate HDL representations of interfaces 825 and 830, which can enable communication between the hardware components 820 and the rest of the system. In particular, a hardware bus control interface 825 is desirably generated for enabling the newly generated hardware components 820 to have direct access to memory elements 835 of the system. Thus, by the way of the bus control interface 825 the newly generated hardware components 820 (implementing system functions calling for memory dereferencing) can control the execution of such memory dereferencing operations with reference to the memory elements 835. Also, as discussed above with reference to FIG. 2, a hardware interface 125 (830 in FIG. 8) controlled by a general purpose processor of the system may be generated to (among other things) allow the modified software components 105A to drive communications such as providing parameters to and returning results from the newly generated hardware components 820.

An Exemplary Electronic System Comprising a Bus Control Interface for Allowing Generated Hardware Components to Control the Execution of Memory Dereferencing Operations Based on the methods described with reference to FIGS. 7 and 8, the exemplary system 900 may be assembled. Thus, as described above, selected software code representations (e.g., in C, C++ or Pascal) of an electronic system's functionality may be converted to a hardware representation (e.g., in an HDL such as VHDL or Verilog) and eventually implemented as actual hardware (e.g., in an FPGA or other programmable logic, an ASIC or a SOC). For instance, system functionality initially implemented as software components (e.g., 105) may be compiled to a hardware representation in HDL (e.g., 820) and eventually implemented as physical hardware (e.g., as hardware assistant processor 105B in FIG. 9). The hardware compiler 810 can parse the software code of a software system component (e.g., 805) for memory dereferencing constructs (e.g., "*" or "->" in the C programming language) and convert such software constructs to HDL representations. Such HDL representations including memory dereferencing operations can eventually be implemented within actual hardware (e.g., 105B in FIG. 9).

Figure 9:
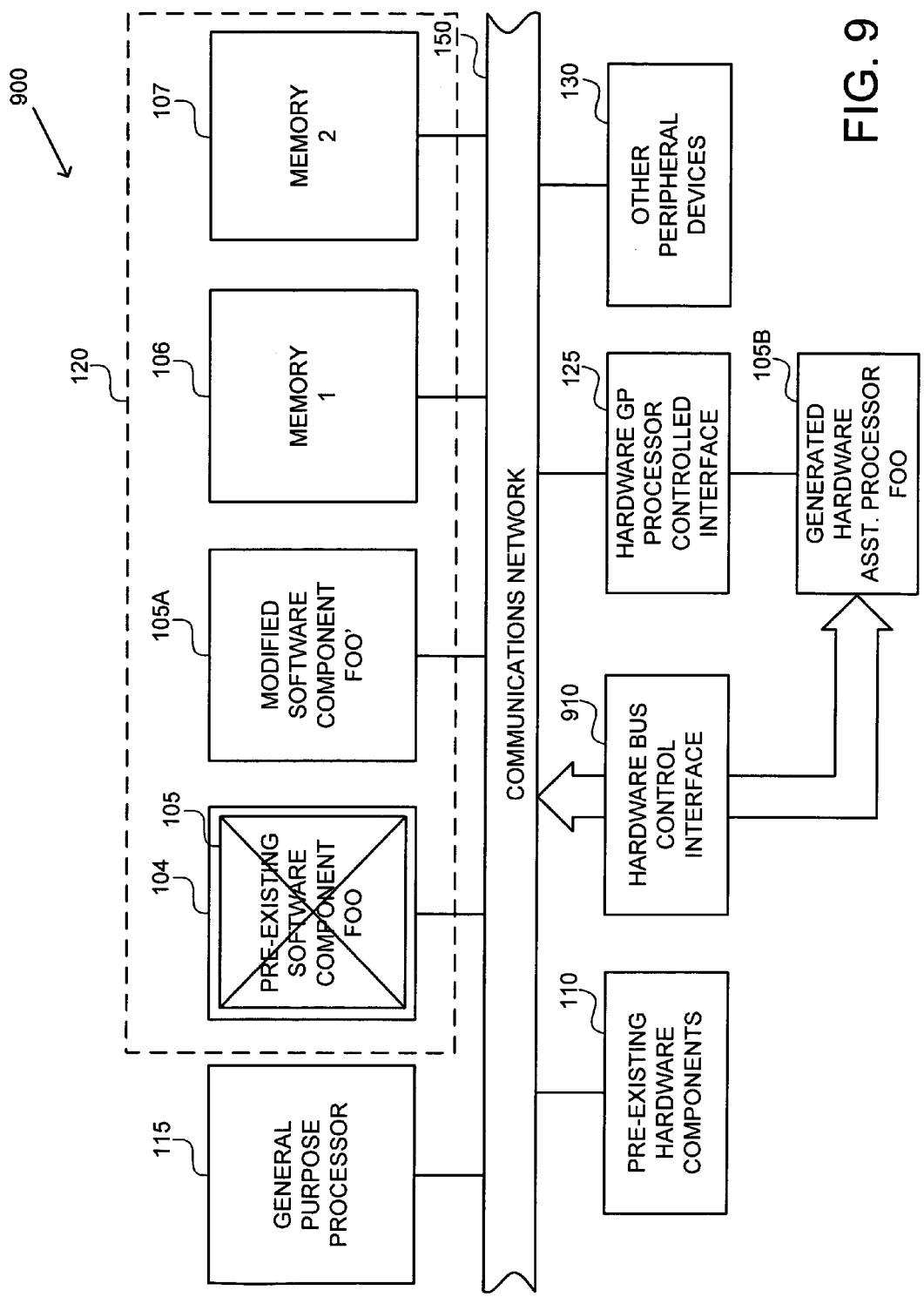
FIG. 9 is a block diagram illustrating an exemplary electronic system reapportioned between its software and hardware components along with a bus control interface that enables newly generated hardware components to control the execution of at least one memory dereferencing operation.

Additionally, the bus control interface 910 is generated to enable the newly generated hardware component (e.g., the hardware assistant processor at 105B FIG. 9) to control the execution of memory dereferencing operations such as reading and writing to memory elements (e.g., 106 and 107 in FIG. 9). Via the bus control interface 910, the newly generated hardware components (e.g., the assistant processor 105B) desirably arbitrates with other devices for use of the communication network 150. Once, it has gained control of the communications network 150, it may send addresses related to memory dereferencing operations, which can be decoded and acted on accordingly.

For instance, returning to FIG. 6A, the function Foo at 600 can be implemented within the newly generated hardware components (e.g., assistant processor 105B). As such, execution of the operation of reading from the memory location a[i] in one of the memory elements 106 or 107 which is based on the pointer variable "a" may be controlled by the newly generated hardware components (e.g., assistant processor 105B) via the bus control interface 910. The address value related to pointer variable "a" may be passed from outside of the function Foo newly implemented in hardware (e.g., assistant processor 105B). For instance, address values for memory dereferencing operations may be passed from other software components of the system. Also, such address values may point to an address location in system memory (e.g., 106 and 107). Nevertheless, the newly generated hardware components (e.g., assistant processor 105B) may dereference such address values via the bus control interface 910.

In one embodiment, the newly generated hardware components (e.g., assistant processor 105B) may have a memory map in which system memory elements (e.g., 106 and 107) are mapped to correspond to their mapping in a memory map associated with the general purpose processor 115 executing the software. With such mapping, for example, any address value that was passed from outside the function implemented as the newly generated hardware components (e.g., assistant processor 105B) may be dereferenced via the bus control interface 910 in the same manner it would be dereferenced by the general purpose processor 115.

However, not all communication related to the newly generated hardware components (e.g., assistant processor 105A) and the rest of the system 900 is required to be via the bus control interface 910. In fact, communications from the modified software components 105A which provide parameters (e.g., a, i, and v in FIG. 6A for function Foo 600) for executing system functions implemented as hardware components (e.g., assistant processor 105B) may continue to be via the hardware interface 125 controlled by the general purpose processor 115. The same may apply to communications related to calculations performed within the hardware assistant processor 105B and returned as results to the rest of the system 900 via the modified software components 105A.

The memory dereferencing operations directed by the newly generated hardware assistant processor 910 relate to the calculations it performs. These memory dereferencing operations are different than those communications that relate to the passing of parameters from the rest of the system to functions implemented in the newly generated hardware components (e.g., assistant processor 105B) and returning of any results of such calculations.

Figure 10:
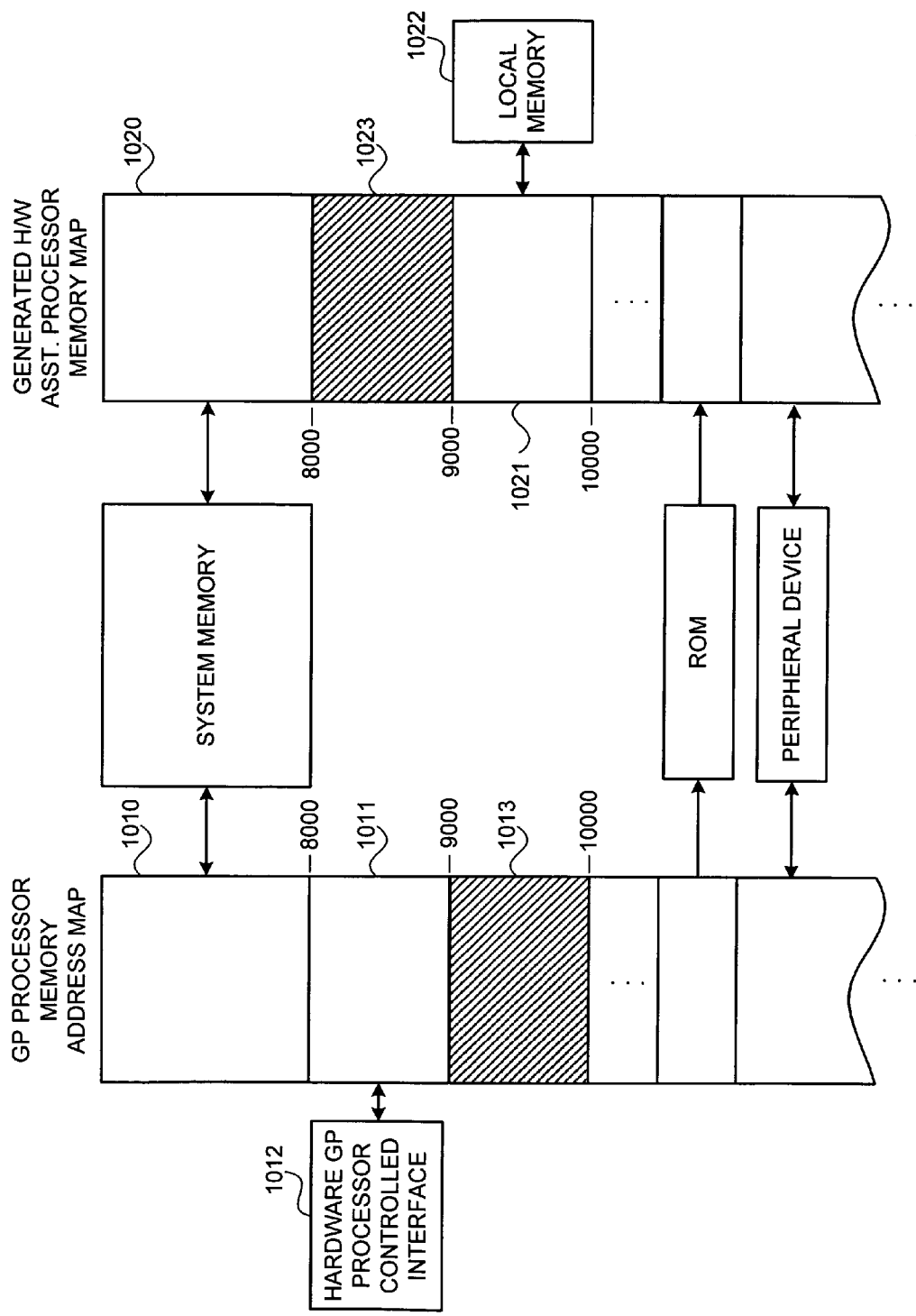
FIG. 10 is a block diagram illustrating exemplary memory maps of a general purpose processor and newly generated hardware components of a selectively repartitioned system, the memory maps allocated in a manner so as to avoid interference between communications via the bus control interface and a hardware interface controlled by a main general purpose processor.

An Exemplary Method for Preventing Interference between Bus Control Interface Communications and Communications Via the Hardware Interface Controlled by a General Purpose Processor Errors may be caused if the newly generated components (e.g., assistant processor 105B) write values into portions of the general purpose processor's 115 address space 1010 of FIG. 10 allocated for uses that conflict or interfere with those of the newly generated hardware components (e.g., assistant processor 105B). For instance, errors may occur if during memory dereferencing operations the assistant processor 105B reads from or writes into certain memory locations within the address space 1010 of the general purpose processor 115 that is allocated to the hardware interface 125.

For example assume that, within the address space 1010 of FIG. 10 of the processor 115 of FIG. 9 executing the modified software components 105A, memory range 8000–9000 at 1011 is allocated for the hardware interface 1012 (e.g., 125 in FIG. 9) controlled by the general purpose processor 115 in FIG. 9. In one exemplary operation related to the execution of the modified software components 105A, a "Go" bit may be set to indicate that parameters have been passed to the generated hardware components (e.g., assistant processor 105B) for execution of those system functions it is implementing and a "done" bit is set to indicate that the generated hardware components (e.g., assistant processor 105B) has completed execution of its function. However, if some calculation is called for within the functions implemented by the generated hardware components (e.g., assistant processor 105B) that writes a value "1" into the same address space at which the processor is searching for a "done" bit to be set to "1" then it may cause the "done" bit set to "1" prematurely. Also, if for some reason the generated hardware components (e.g., assistant processor 105B) perform an operation that writes a value "1" into an address location which the processor 115 may use for setting the "Go" bit needed to start execution of the generated hardware components (e.g., assistant processor 105B) then that may result in the generated hardware components (e.g., assistant processor 105B) unnecessarily starting their own execution when they are already executing. Therefore, it may be useful to prevent such interference between communications related to the bus control interface (e.g., 910 of FIG. 9) controlled by the newly generated hardware (e.g., assistant processor 105B) and those communications related to the hardware interface 125 controlled by the general purpose processor 115.

This may be accomplished by appropriate allocation of the address space 1010 of the processor 115 and the address space 1020 of the generated hardware components (e.g., assistant processor 105B). For instance, FIG. 10 illustrates one such allocation of addresses spaces for the processor 115 and the newly generated hardware components (e.g., assistant processor 105B). As shown, a portion 1011 of the general purpose processor address space 1010 is allocated to the hardware interface 1012. The portion 1011 is shown as comprising address ranges from 8000 to 9000. Address ranges 1013 between 9000 and 10000 remain unallocated. However, to ensure that the generated hardware components (e.g., assistant processor 105B) do not write into locations in the address space 1011 that are allocated within the processor address space 1010 for the hardware interface 125 it controls, the same range of addresses (8000–9000) at 1023 in the assistant processor's address space 1020 is unallocated. Alternatively, the same range of addresses (e.g., 8000–9000 in 1023 FIG. 10) may be allocated to any other device besides the hardware interface 1012 (e.g., 125 in FIG. 9) controlled by the processor 115. For instance, a memory device 1022 that is local to the generated hardware components (e.g., assistant processor 105B) may be allocated to a memory range 1023 between 8000 and 9000.

In an another alternative, for instance, the memory device 1022 that is local to the generated hardware components (e.g., assistant processor 105B) may be allocated to the memory range 1021 between 9000 and 10000 in the newly generated hardware components' (e.g., assistant processor 105B) address space 1020. The local memory device 1022 may be a set of registers created in the newly generated hardware components (e.g., assistant processor 105B) or it may be other memory devices mapped to the generated hardware's (e.g., 105B) memory space 1020 but not to the processor's 115 memory space 1010. Nevertheless, such local memory 1022 may be used to perform memory operations related to variables local to the functions implemented within the newly generated hardware components (e.g., assistant processor 105B). For instance, pointer variables that are local to the functions implemented within the newly generated hardware components (e.g., assistant processor 105B) may be compiled to point to address locations within the local memory 1022. As shown in FIG. 10, such local memory may not be addressable to the general purpose processor 115 because the memory range 9000–10000 (1013) in the general purpose processor's address space 1010 remains unallocated. Alternatively, however the local memory may be made addressable to the general purpose processor by allocating the memory address range 1013 to local memory 1022.

In another alternative, no such measures described above for preventing interference between bus control interface 910 communications in FIG. 9 and communications via the hardware interface 125 controlled by a general purpose processor 115 may be needed. This may be so because if system components are compiled appropriately to generate executable software and hardware there should be no such interference. However, the measures described above including the memory map allocations are exemplary approaches by which occurrences of errors related to such interferences may be reduced.

In one embodiment, such mapping of the generated hardware components' (e.g., assistant processor 105B) address space 1020 may be automatically implemented based on knowledge of the processor's (e.g., FIG. 9 at 115) address space (e.g., 1010). Furthermore, allocation of a local memory 1022 to the range of addresses (e.g., 9000–10000 at 1023) in the address space 1020 may also be automatic. Also, by generating memory maps as described above, addresses related to system memory (e.g., 106 and 107 in FIG. 9) and local memory 1022 in FIG. 10 may both be dereferenced by the newly generated hardware components (e.g., assistant processor 105B in FIG. 9) without any additional effort needed to distinguish between such addresses.

Figure 11:
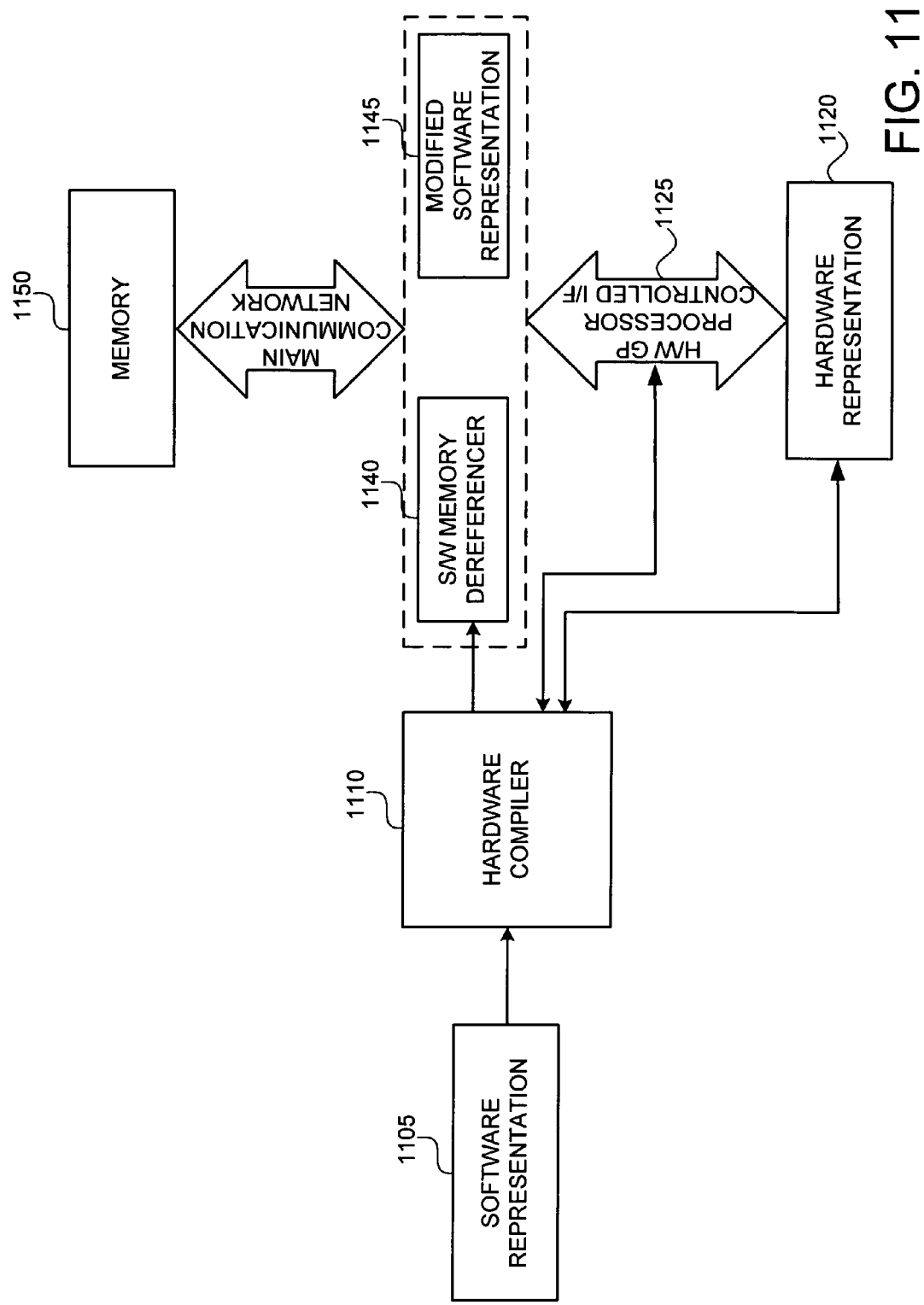
FIG. 11 is a block diagram illustrating an exemplary system and method for compiling software code representations comprising memory dereferencing operations into a hardware representation and generating a software memory dereferencer to enable the newly generated hardware to control the execution of at least one memory dereferencing operation.

An Exemplary System for Implementing Memory Dereferencing Operations in Generated Hardware Using a Generated Software Memory Dereferencer FIG. 11 illustrates exemplary methods and systems for implementing an electronic system (e.g., 1200 of FIG. 12) wherein newly generated hardware components (e.g., assistant processor 105B in FIG. 12) can control the execution of memory dereferencing operations related to system functionality. As shown in FIG. 11, a software code representation 1105 of software components of a system may be compiled by an EDA tool such as the hardware compiler 1110 to generate a hardware representation of the system component 1120 (e.g., as HDL such as Verilog, VHDL or System C). The compiler tool may also generate a hardware interface 125 controlled by the general purpose processor 115. Alternatively, the hardware interface 1125 controlled by the general purpose processor 115 may be generated by another tool. The modified software components 1145 may also be generated by the hardware compiler 1110 itself or other tools. Furthermore, a memory dereferencer 1140 may be implemented as software, for instance. Thus, the memory dereferencing operations may be controlled by the newly generated hardware components (e.g., assistant processor 105B of FIG. 11) by directing memory dereferencing requests to the memory dereferencer 1140 which can then determine the memory addresses involved and whether the requests relate to memory reads or writes. The memory dereferencer 1140 can then arbitrate for control of the communications network 150 of FIG. 12 to conduct the memory dereferencing operations including those related to the system memory elements 1150 (e.g., 106 and 107 of FIG. 12).

Figure 12:
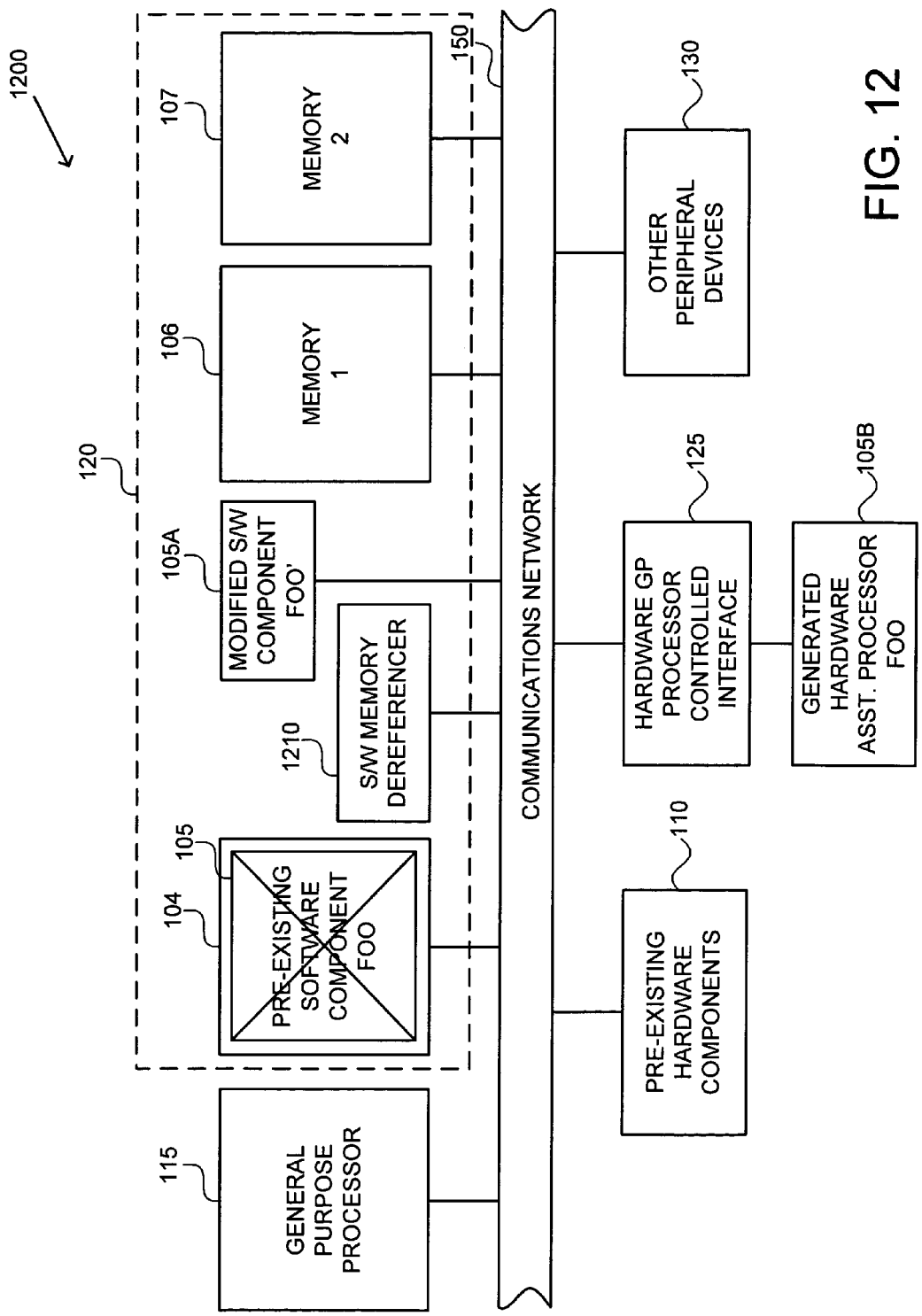
FIG. 12 is a block diagram illustrating an exemplary electronic system selectively reapportioned between its software and hardware components along with a software memory dereferencer that enables newly generated hardware components to control the execution of memory dereferencing operations.

FIG. 12 illustrates an exemplary electronic system 1200 comprising a generated hardware components (e.g., assistant processor 105B) for implementing system functionality originally implemented as software 105. As shown, the generated hardware components (e.g., assistant processor 105B) can direct memory dereferencing operations via the interface 125 by using a software memory dereferencer 1210. For instance, to execute a memory read operation related to a memory address within system memory elements (e.g., 106 and 107) the generated hardware components (e.g., assistant processor 105B) can send a request to the software memory dereferencer 1210. The software memory dereferencer 1210 can then determine the address data, dereference the address to read a value stored within such address and return the value to the generated hardware components (e.g., assistant processor 105B).

However, memory dereferencer 1210 need not be limited to a software implementation. In fact, it may implemented as hardware (e.g., FPGAs or other programmable logic or ASIC or SOC). The functionality of such a memory dereferencer 1210 may also be implemented as a combination of software and hardware.

Figure 13:
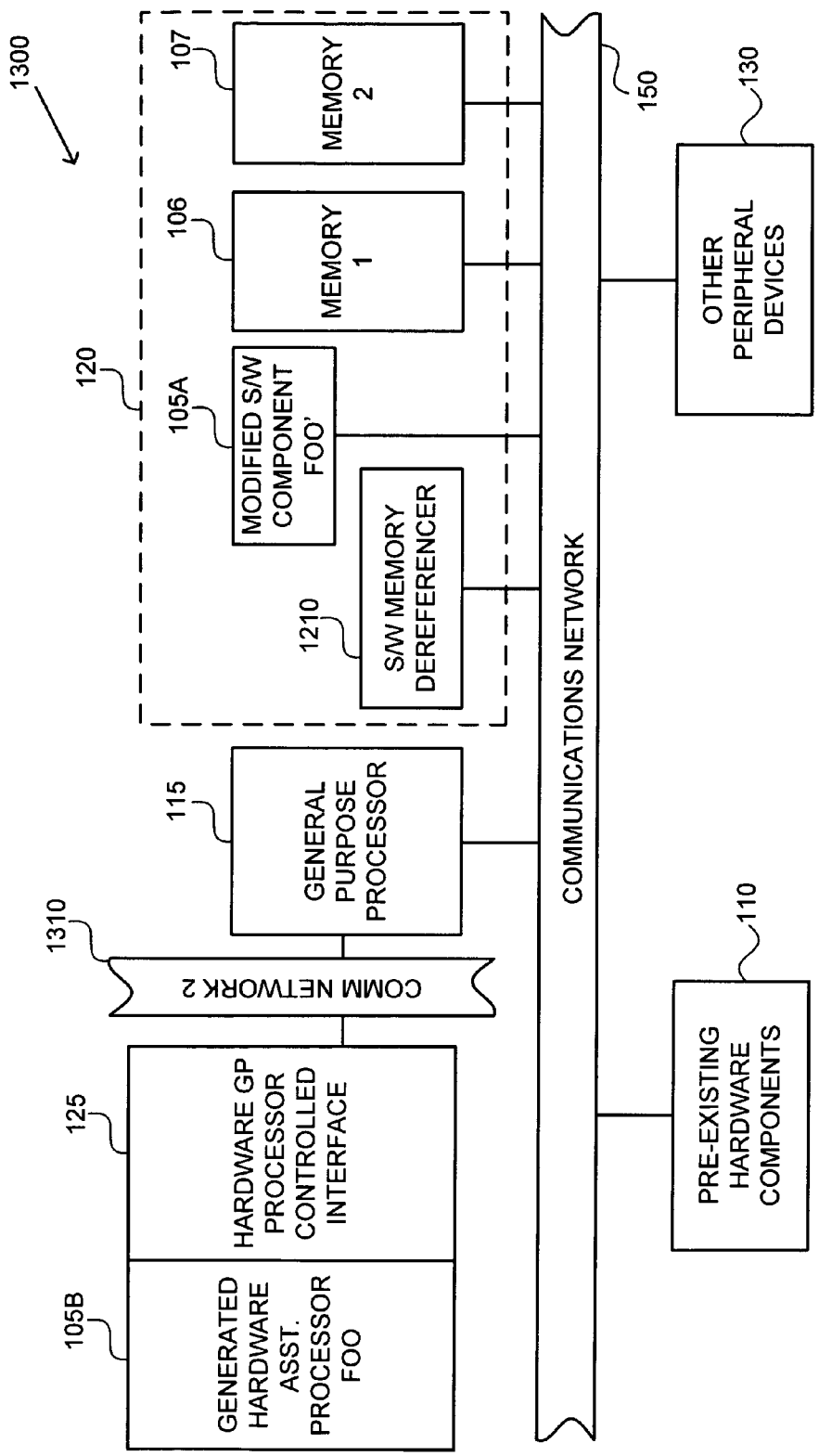
FIG. 13 is a block diagram illustrating an exemplary electronic system selectively reapportioned between its software and hardware components, wherein at least some of the newly generated hardware components are directly communicative with a communications network other than the main communications network of the system and a software memory dereferencer is used to enable such newly generated hardware components to control the execution of memory dereferencing operations.

An Exemplary System for Implementing Memory Dereferencing Operations in Generated Hardware Associated with a General Purpose Processor Local Communications Network As shown in FIG. 12, for instance, the generated hardware assistant processor 105B may share access to a system's main communications network 150 with the memory elements (e.g., 106 and 107) at which the generated hardware components (e.g., assistant processor 105B) directs its memory dereferencing operations. However, in some implementations it may be beneficial for the generated hardware components (e.g., assistant processor 105B) to be connected directly to another communications network that is not also shared directly by the memory elements (e.g., 106 and 107) at which the generated hardware components (e.g., assistant processor 105B) may direct memory dereferencing operations. Thus, as shown in FIG. 13, the generated hardware components (e.g., assistant processor 105B) may be connected to another communications network 1310 that is local to a main general purpose processor 115.

In this example, the generated hardware assistant processor 105B may use the interface 125 and the memory dereferencer 1210 to control the execution of the memory dereferencing operations. Thus, as shown in FIG. 13, the generated hardware assistant processor 105B (connected to a local network 1310) may direct memory dereferencing operations at the software dereferencer 1210 in order to control the execution of memory dereferencing operations related to the memory elements (e.g., 106 and 107) connected to another communications network (e.g., 150).

The second communications network need not be limited to a processor local bus 1310. An alternative communications network may be any communications network to which memory elements that are the subject of memory dereferencing operations directed by an assistant processor do not have direct access to.

Figure 4:
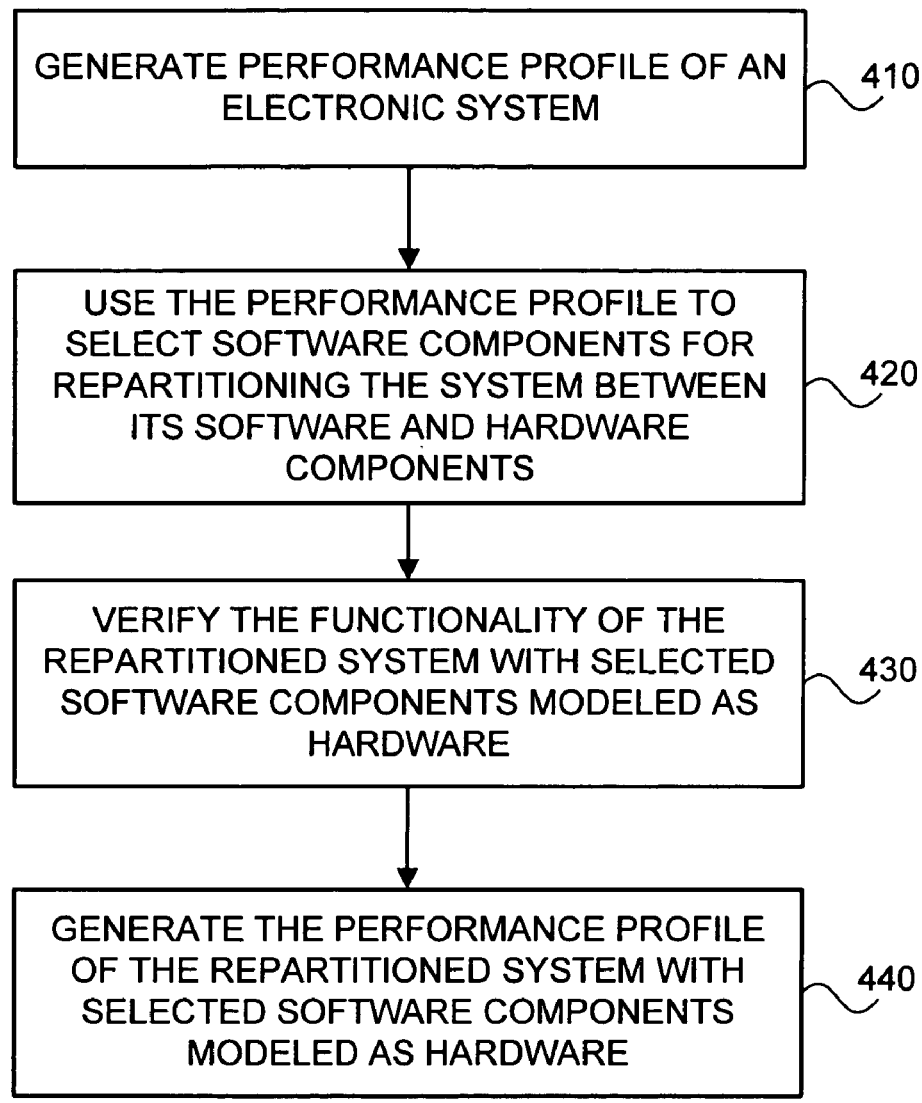
FIG. 4 is a flow diagram describing exemplary methods for using performance profile data in order to optimally select the software components to be implemented as hardware instead.

An Exemplary Method for Optimizing a Hardware Implementation of System Functions based on Volatility of the Memory Dereferencing Operations The methods and systems described above for implementing selected system functions comprising memory dereferencing operations can be combined with the methods of reapportioning a system's functions between its hardware and software components as described with reference to FIG. 4. According to the description of FIG. 4, once system functions are selected to be implemented as hardware, they may be modeled as hardware and the newly reapportioned system's functionality may be verified and its performance may be measured to create a performance profile. These performance profiles may then be used to decide whether implementing selected functions in hardware would improve the performance of the system overall.

Figure 14:
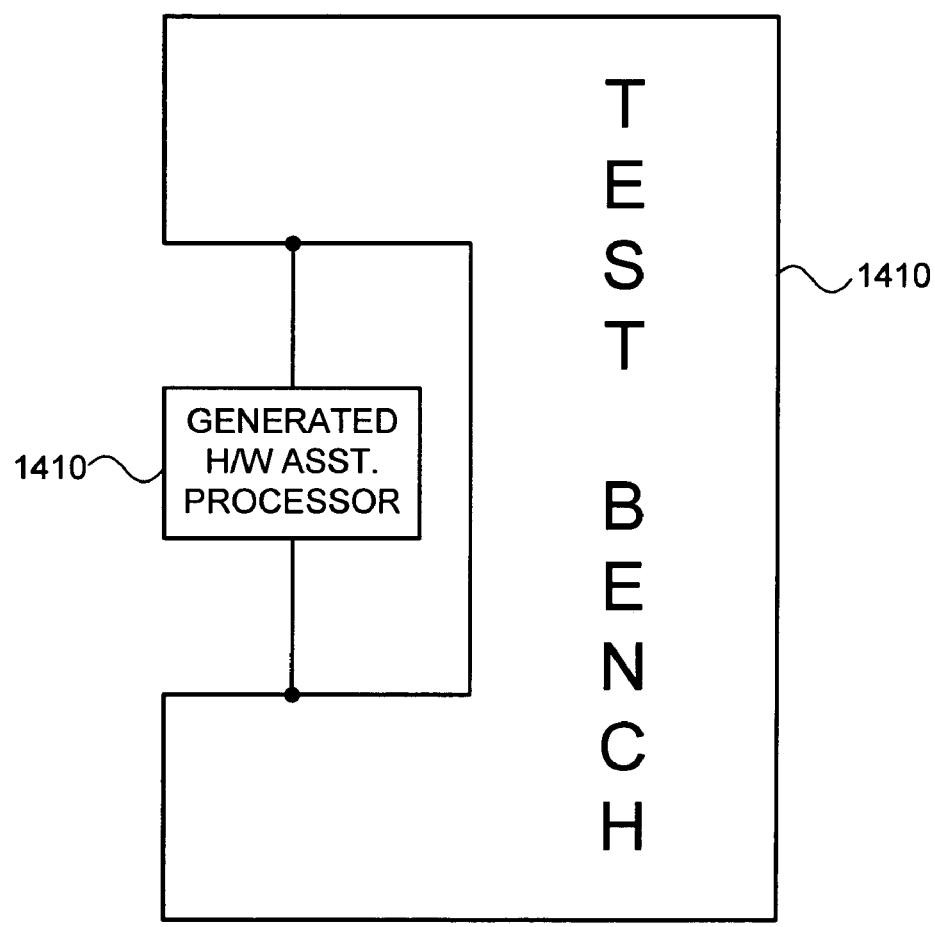
FIG. 14 is a block diagram illustrating exemplary methods for driving selected hardware components using data collected from a previous execution of a software version of the system.

However, as mentioned above and discussed in further detail in FIG. 4 of the published U.S. patent application Ser. No. 10/295,193 (U.S. Pub. No. US-2004-0098242-A1) and its related detailed description, a system, once it is repartitioned between its hardware and software components, need not be co-simulated again to obtain its performance profile data or to verify its functionality. Instead, as shown in FIG. 14, the system's performance data collected when the system was modeled earlier may be used as a test bench 1410 to drive the newly generated hardware components (e.g., the assistant processor 1420). In this manner, data related to performance of the hardware components (e.g., assistant processor 1420) may be collected individually and appropriately patched to the test bench data 1410 to create a performance profile of the entire system. In addition, proper functionality of the generated hardware components (e.g., assistant processor 1420) may be verified with respect to the rest of the system.

The test bench data 1410 may have been generated by first executing the system functions implemented entirely as software code (e.g., in C, C++, or Pascal). Various software compilers perform various code optimizations, which can affect the final values of the test bench data 1410 generated from memory images of the software code execution. Consider the following simple exemplary code for instance:

```
FooA ( ){
a[i] = 10;
a[i] = 4;
a[i] = i;
}
```

Some of this code above may be optimized by a compiler because the same memory location a[i] is repeatedly assigned different values without the intermediate values being used elsewhere in the program code. Thus, the last assignment a[i]=i may be the only one of interest. In this case, the first two instruction lines a[i]=10 and a[i]=4 may be eliminated by the compiler and never written to the memory location. However, not every compiler optimizes code in the same way. For instance, the hardware compiler 510 of FIG. 5 may have its own peculiar code optimizations that can be different than that of a software code compiler used to generate the test bench data 1410. Alternatively, the hardware compiler 510 may not optimize code at all. In such a case, it is possible that when verifying the performance of the generated hardware components (e.g., assistant processor 1420) with respect to the test bench data 1410 some of the read and write operations implemented in the hardware components (e.g., assistant processor 1420) may not exactly match what is captured in the test bench data 1410.

For instance, the hardware components (e.g., assistant processor 1420) may not reflect code optimizations that eliminate the first two instruction lines a[i]=10 and a[i]=4 in the above example. Thus, a hardware implementation of the function FooA within the hardware assistant processor 1420 may not mirror the test bench data 1410 obtained from execution of a software implementation of the same FooA function. In some instances this may be acceptable because it would be sufficient to verify that a value at a given memory location prior to execution of a function (e.g., FooA) and a value at the end of such execution is the same between what is generated by the generated hardware assistant processor 1420 and what is recorded within the test bench data 1410.

However, in other circumstances such a discrepancy may not be acceptable. For instance, if a location in the memory map of the hardware assistant processor 1420 (e.g., array location a[i] above) is mapped to correspond to a peripheral device (e.g., video monitor or a printer or the like) then operations related to reading from or writing to such a device should not be eliminated through optimization. This may be because each of such read and write operations may further affect the peripheral devices in a manner that cannot be predicted. Such volatility is one reason that operations related to reading from or writing to certain locations of memory map of the hardware assistant processor 1420 should not be subject to code optimization. This also holds true for operations that relate to reading from and writing to those areas of a memory map of a processor (e.g., 115 of FIG. 1) that executes the software code version of the system function used to generate the test bench data 1410.

Figure 15:
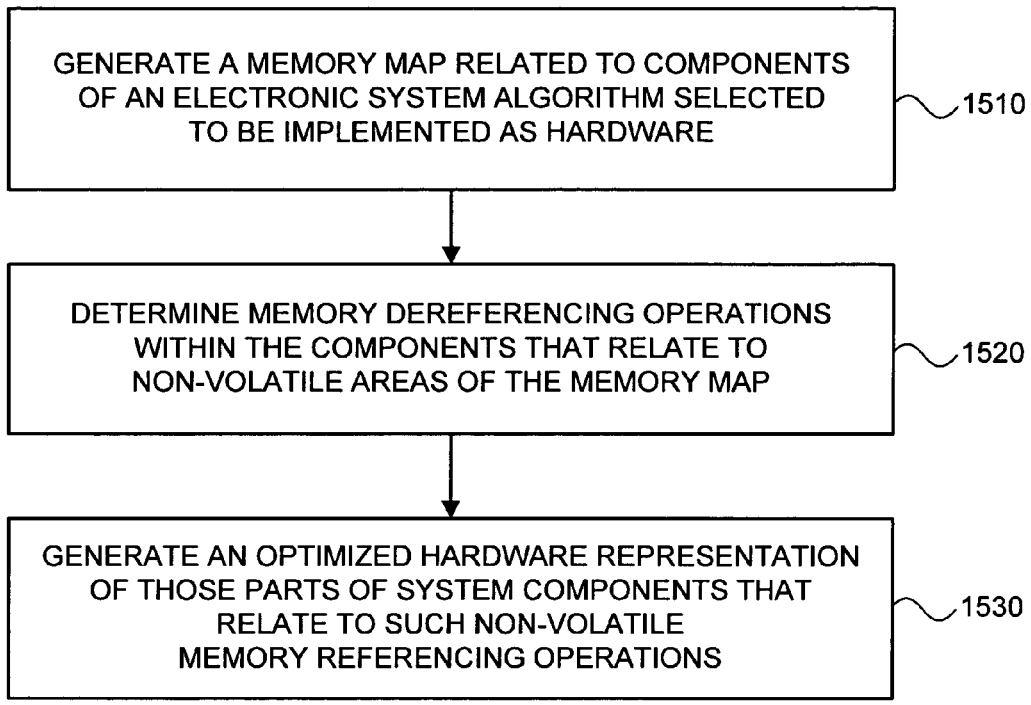
FIG. 15 is a flow diagram of a method for generating a code optimized hardware representation from a software code representation of selected system components based on whether one or more of its memory dereferencing operations relate to non-volatile regions of the memory map.

Thus, as shown in FIG. 15, the hardware compiler 510 of FIG. 5 may generate an optimized hardware representation (e.g., in HDL such as in Verilog, VHDL, or System C) at least with regard to those memory dereferencing operations that relate to non-volatile areas of the memory map. For instance, at 1510, a memory map may be generated that corresponds to those components of a system that are selected for implementation as hardware. Later, at 1520, based on the software implementation of the selected components, at least some of those memory dereferencing operations that relate to non-volatile areas (e.g., those that do not relate to read and write operations directed at a peripheral device) of such a memory map may be identified. At 1530, an optimized hardware representation of those parts of the system that relate to non-volatile memory referencing operations is generated. Not all possible optimizations need to be implemented. Selected optimizations may be implemented depending on the hardware compiler. Alternatively, no optimizations may be implemented.

Furthermore, with regard to memory dereferencing operations related to non-volatile areas of the memory map, the hardware implementation need not mirror the software implementation. Instead, identity in functionality between a software implementation and a hardware implementation of selected system functionality may be verified by comparing a beginning and an ending value at such memory locations after execution of the software implementation and hardware implementations. However, with regard to memory dereferencing operations related to volatile areas of a memory map (e.g., those mapped to a peripheral device), each such memory dereferencing operation should be identically implemented in both software and hardware.

Exemplary Implementation in a Distributed Network Environment

Figure 16:
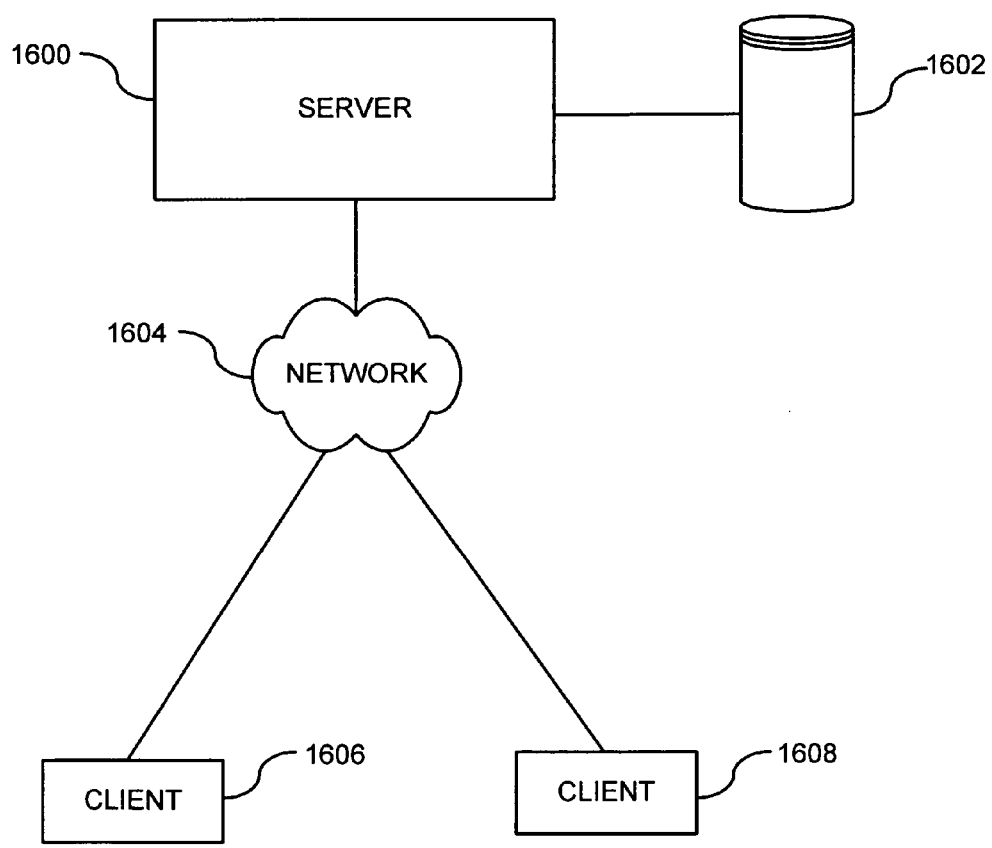
FIG. 16 is a diagram illustrating an exemplary client-server network environment.

Any of the aspects of the technology described above may be performed or designed using a distributed computer network. FIG. 16 shows one such exemplary network. A server computer 1600 can have an associated storage device 1602 (internal or external to the server computer). For example, the server computer 1600 can be configured to convert software code representations comprising instructions related to memory dereferencing operations into hardware representations using any of the embodiments described above. The server computer 1600 may be coupled to a network, shown generally at 1604, which can comprise, for example, a wide-area network, a local-area network, a client-server network, the Internet, or other such network. One or more client computers, such as those shown at 1606, 1608, may be coupled to the network 1604 using a network protocol.

Figure 17:
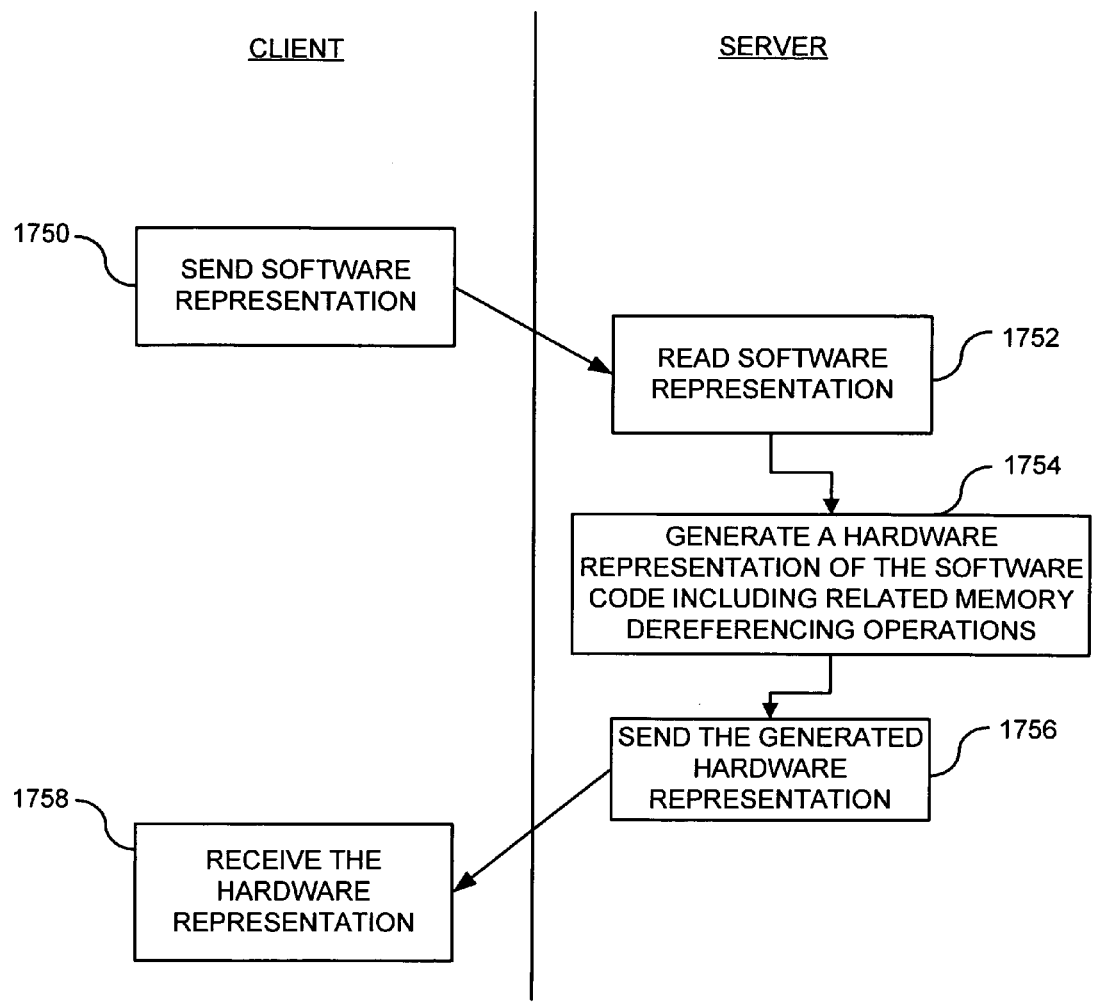
FIG. 17 is a diagram illustrating an exemplary method of converting a software representation of selected electronic system functions including any memory dereferencing operations to a hardware representation using a client-server network, such as the one illustrated in FIG. 16.

FIG. 17 shows that a client computer (e.g., 1606 and 1608) receives hardware representation (e.g., in HDL such as Verilog, VHDL, or System C) converted at least partially from software representations including any memory dereferencing operations according to any of the embodiments disclosed herein using a remote server computer, such as the server computer 1600 shown in FIG. 16. In process block 1750, for example, a client computer sends software representations of selected electronic system functions. In process block 1752, software representations of selected electronic system functions are read, according to any of the disclosed embodiments. In process block 1754, software representations of selected electronic system functions including any memory dereferencing operations are converted to a hardware representation. In process block 1756, the server computer sends the hardware representation to the client computer which receives the hardware representation in process block 1758. It should be apparent to those skilled in the art that the example shown in FIG. 17 is not the only way to generate a hardware representation of selected software representations of electronic system functions including any memory dereferencing operations. For instance, the client computer that sends the software representation may not be the same client that receives the converted hardware representation. Also, the software representation, the hardware representation and any code related to implementing methods described herein may be stored in a computer-readable media that is not on a network and that is sent separately to the server. Or, the server computer may perform only a portion of the procedures described herein.

Having described and illustrated the principles of our invention with reference to the illustrated embodiments, it will be recognized that the illustrated embodiments can be modified in arrangement and detail without departing from such principles. For instance, many of the examples discussed above describe exemplary implementations of electronic system functionality initially implemented at least partially in a high-level programming such as C, C++ or Pascal. However, the principles illustrated in the examples and the rest of the detailed description are also applicable to electronic system functionality initially implemented in an assembly language such as, IA-32 (Intel® architecture-32 bit) or IA-64 (Intel® architecture-64 bit).

Thus, in view of the many possible embodiments to which the principles of the invention may be applied, it should be recognized that the illustrated embodiments are examples of the invention and should not be taken as a limitation on the scope of the invention. For instance, various components of systems and tools described herein may be combined in function and use. We therefore claim as our invention all subject matter that comes within the scope and spirit of these claims.

We claim:

1. A method for converting a software code representation of at least one software component of an electronic system into hardware, the electronic system comprising at least one general purpose processor, at least one system memory having system memory elements, and at least one main communications network, the method comprising:

compiling the software code representation of at least a portion of the at least one software component of the electronic system including one or more instructions related to at least one memory dereferencing operation into a hardware representation having a memory map, at least a portion of system memory elements being mapped to the memory map; and generating at least one interface to the main communications network of the system for the hardware representation to control execution of the at least one memory dereferencing operation;

wherein the at least one memory dereferencing operation relates to an address in the at least one system memory connected to the main communications network of the system.

2. The method of claim 1, wherein an address related to the at least one memory dereferencing operation is at least partially provided by a component of the electronic system other than the hardware representation.

3. The method of claim 1, wherein the hardware representation is in a hardware description language selected from a group consisting of VHDL, Verilog, System C, HandelC, BachC, SpecC and System Verilog.

4. The method of claim 1, wherein the at least one generated interface is in a hardware description language selected from a group consisting of VHDL, Verilog, SystemC, HandelC, BachC, SpecC and System Verilog.

5. The method of claim 1, wherein the software code representation of the at least one software component of the electronic system is in a programming language selected from a group consisting of C, C++ and Pascal.

6. The method of claim 1, wherein the at least one generated interface to the main communications network of the electronic system for the hardware representation to control the execution of the at least one memory dereferencing operation comprises a bus control interface adapted to arbitrate for direct control of the at least one main communications network of the electronic system.

7. The method of claim 6, wherein the at least one main communications network is selected from a group consisting of a processor bus, a system bus, a hierarchical bus, a cross bar, a multiplexer bus, a switch network and a point to point network.

8. The method of claim 6, further comprising memory mapping a hardware interface controlled by the at least one general purpose processor of the electronic system into memory ranges not accessible to the hardware representation.

9. The method of claim 1, wherein the at least one generated interface to the at least one main communications network of the system comprises a software memory dereferencer adapted to implement requests from the hardware representation to control the execution of the at least one memory dereferencing operation.

10. A method for converting a software code representation of at least one software component of an electronic system into hardware, the electronic system comprising at least one general purpose processor, at least one system memory and at least one main communications network, the method comprising:
   compiling the software code representation of at least a portion of the at least one software component of the electronic system including one or more instructions related to at least one memory dereferencing operation;
   generating at least one interface to-the main communications network of the system for the hardware representation to control execution of the at least one memory dereferencing operation;
   determining whether the at least one memory dereferencing operation relates to non-volatile ranges of a memory map of the hardware representation; and
   if the at least one memory dereferencing operation does not relate to the non-volatile ranges of the memory map then optimizing at least a portion of the hardware representation related to the at least one memory dereferencing operation.

11. A method for converting a software code representation of at least one software component of an electronic system into hardware, the electronic system comprising at least one general purpose processor, at least one system memory and at least one main communications network, the method comprising:
   compiling the software code representation of at least a portion of the at least one software component of the electronic system including one or more instructions related to at least one memory dereferencing operation;
   generating at least one interface to-the main communications network of the system for the hardware representation to control execution of the at least one memory dereferencing operation;
   determining whether the at least one memory dereferencing operation relates to volatile ranges of a memory map of the hardware representation; and
   if the at least one memory dereferencing operation does relate to the volatile ranges of the memory map then not optimizing at least those portions of the hardware representation that relate to the at least one memory dereferencing operation.

12. The method of claim 11, wherein the volatile ranges of the memory map correspond to one or more peripheral devices associated with the electronic system.

13. A method for reapportioning an electronic system between its software code components and hardware components, the electronic system comprising at least one general purpose processor and at least one main communications network, the method comprising:
   generating a performance profile of the system based on an existing apportionment between its hardware components and software code components;
   based on data from the performance profile, selecting at least one software code component to be implemented as a hardware component for implementing at least one functionality of the electronic system originally implemented in the selected software code component;
   compiling at least a portion of the selected software code component including at least one memory dereferencing operation comprised therein to generate a hardware representation of the hardware component; and
   generating at least one communication interface wherein the hardware component controls execution of the at least one memory dereferencing operation through the communication interface; and
   wherein the at least one memory dereferencing operation relates to an address in system memory connected to the at least one main communications network.

14. The method of claim 13, further comprising modeling a reapportioned electronic system by modeling at least a portion of the generated hardware representation.

15. The method of claim 14, further comprising, generating a performance profile of the modeled reapportioned electronic system and based on data from the performance profile of the modeled reapportioned system, determining whether to implement at least a portion of the generated hardware representation in actual hardware.

16. The method of claim 15, further comprising synthesizing at least a portion of the generated hardware representation to a gate-level hardware representation using synthesis tools.

17. The method of claim 16, further comprising using physical synthesis tools to synthesize the gate-level hardware representation into the actual hardware.

18. The method of claim 17, wherein the actual hardware is a field programmable gate array.

19. The method of claim 17, wherein the actual hardware is an application specific integrated circuit.

20. The method of claim 17, wherein the actual hardware is a system on chip.

21. The method of claim 13, wherein the selected software code component is implemented in a software programming language selected from a group consisting of C, C++ and Pascal.

22. The method of claim 13, wherein at least a portion of the generated hardware representation is in a hardware description language selected from a group consisting of VHDL, Verilog, System C, HandelC, BachC, SpecC and System Verilog.

23. The method of claim 13, wherein generating the at least one communication interface to enable the hardware component to control execution of the at least one memory dereferencing operation comprises generating a hardware representation of a bus control interface.

24. The method of claim 23, wherein the bus control interface is generated in a hardware description language selected from a group consisting of VHDL, Verilog, SystemC, HandelC, BachC, SpecC and System Verilog.

25. The method of claim 23, wherein the bus control interface is generated upon detecting at least one instruction related to the at least one memory dereferencing operation implemented within the selected software code component.

26. The method of claim 23, wherein the bus control interface is adapted to arbitrate for direct control of the at least one main communications network of the electronic system.

27. The method of claim 23, further comprising allocating memory ranges in a memory map associated with the generated hardware representation so as to avoid conflicting memory transactions related to a hardware interface controlled by the at least one general purpose processor.

28. The method of claim 27, wherein the bus control interface is generated in a hardware description language selected from a group consisting of VHDL, Verilog, and System C.

29. The method of claim 13, wherein generating the at least one communication interface to enable the hardware component to control execution of the at least one memory dereferencing operation comprises generating a software representation of a memory dereferencer.

30. The method of claim 13, wherein generating the at least one communication interface to enable the hardware component to control execution of the at least one memory dereferencing operation comprises:
verifying whether at least a portion of the generated hardware representation is connected directly to a communications network other than the at least one main communications network of the system; and
for those portions of the hardware representations connected directly to the communications network other than the at least one main communications network of the system, generating a software representation of a memory dereferencer.

31. An apparatus for converting a software code representation of at least one function of an electronic system to a hardware implementation, the electronic system comprising at least one general purpose processor and at least one main communications network, the apparatus comprising a hardware compiler operable for:

parsing the software code representation of the at least one electronic system function;
generating a hardware representation of at least a portion of the software code representation including at least one instruction within the software code representation for executing at least one memory dereferencing operation; and
based on detecting the at least one instruction for executing the at least one memory dereferencing operation, generating at least one interface through which the generated hardware representations can attain control over the at least one main communications network of the electronic system;
using the at least one interface, the hardware representation sending at least one address related to the at least one memory dereferencing operation over the at least one main communications network to another location within the hardware implementation.

32. An apparatus for reapportioning an electronic system between its hardware components and software components, the electronic system comprising at least one general purpose processor and at least one main communications network the apparatus comprising:
a software execution vehicle for executing the software components of the system;
a hardware execution vehicle for modeling the hardware components of the system; and
one or more processors communicative with the hardware execution vehicle and the software execution vehicle and programmed for:
receiving data from the hardware execution vehicle and the software execution vehicle;
based on a performance profile of the system selecting at least one software component to be converted to a hardware representation;
converting the at least one selected software component to a hardware description language representation including at least one instruction related to at least one memory dereferencing operation; and
generating at least one communications interface through which the hardware components can obtain control of the at least one main communications network associated with the electronic system; wherein an address related to the at least one memory dereferencing operation is at least partially provided by a component of the electronic system other than the hardware representation.

* * * * *